(12) United States Patent
Ikeda et al.

(10) Patent No.: US 9,523,031 B2
(45) Date of Patent: Dec. 20, 2016

(54) ORGANIC ELECTROLUMINESCENT DEVICE

(75) Inventors: Kiyoshi Ikeda, Sodegaura (JP); Mitsunori Ito, Sodegaura (JP); Takashi Arakane, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 913 days.

(21) Appl. No.: 11/587,093

(22) PCT Filed: May 6, 2005

(86) PCT No.: PCT/JP2005/008353
§ 371 (c)(1),
(2), (4) Date: Oct. 20, 2006

(87) PCT Pub. No.: WO2005/112519
PCT Pub. Date: Nov. 24, 2005

(65) Prior Publication Data
US 2007/0224448 A1    Sep. 27, 2007

(30) Foreign Application Priority Data

May 14, 2004 (JP) .................... 2004-144732

(51) Int. Cl.
H05B 33/14 (2006.01)
C09K 11/06 (2006.01)
H01L 51/00 (2006.01)
H01L 51/50 (2006.01)

(52) U.S. Cl.
CPC .......... *C09K 11/06* (2013.01); *H01L 51/0072* (2013.01); *H05B 33/14* (2013.01); *C09K 2211/1007* (2013.01); *C09K 2211/1011* (2013.01); *C09K 2211/1029* (2013.01); *C09K 2211/1044* (2013.01); *C09K 2211/185* (2013.01); *C09K 2211/186* (2013.01); *H01L 51/006* (2013.01); *H01L 51/0065* (2013.01); *H01L 51/0078* (2013.01); *H01L 51/0081* (2013.01); *H01L 51/0085* (2013.01); *H01L 51/5016* (2013.01)

(58) Field of Classification Search
USPC ....................................... 428/690
See application file for complete search history.

(56) References Cited

U.S. PATENT DOCUMENTS

| | | | | |
|---|---|---|---|---|
| 6,562,982 | B1 * | 5/2003 | Hu et al. .................. | 548/440 |
| 6,661,023 | B2 * | 12/2003 | Hoag et al. ................ | 257/40 |
| 2002/0034656 | A1 * | 3/2002 | Thompson ........... | C07D 209/86 428/690 |
| 2003/0044643 | A1 * | 3/2003 | Arakane et al. ............ | 428/690 |
| 2003/0186081 | A1 * | 10/2003 | Sotoyama et al. .......... | 428/690 |
| 2004/0086745 | A1 * | 5/2004 | Iwakuma ............ | C07D 401/10 428/690 |
| 2004/0135167 | A1 | 7/2004 | Nii | |
| 2005/0127823 | A1 * | 6/2005 | Iwakuma et al. ............. | 313/504 |
| 2005/0186446 | A1 * | 8/2005 | Shitagaki et al. ............ | 428/690 |
| 2006/0141284 | A1 * | 6/2006 | Tomita et al. ................ | 428/690 |
| 2010/0044638 | A1 | 2/2010 | Ise et al. | |
| 2010/0069636 | A1 | 3/2010 | Shitagaki et al. | |

FOREIGN PATENT DOCUMENTS

| | | | |
|---|---|---|---|
| EP | 1 205 527 A1 | 5/2002 | |
| EP | 1 679 940 A1 | 7/2006 | |
| EP | 1 718 121 A1 | 11/2006 | |
| EP | 1 718 122 A1 | 11/2006 | |
| EP | 1 724 323 A1 | 11/2006 | |
| EP | 1 727 396 A1 | 11/2006 | |
| JP | 2002-100476 | 4/2002 | |
| JP | 2002-305084 | 10/2002 | |
| JP | 2003 142269 | 5/2003 | |
| JP | 2003-268362 | 9/2003 | |
| JP | 2003-277743 | 10/2003 | |
| JP | 2004 002351 | 1/2004 | |
| JP | 2004-71380 | 3/2004 | |
| JP | 2004 071380 | 3/2004 | |
| JP | 2005-82644 | 3/2005 | |
| JP | 2005-82645 | 3/2005 | |
| JP | 2005-82701 | 3/2005 | |
| JP | 2005-289914 | 10/2005 | |
| KR | 10-2004-0094842 * | 11/2004 | ............. C09K 11/06 |
| WO | 00/57676 * | 9/2000 | ............. H05B 33/12 |
| WO | WO-03/078541 A1 * | 9/2003 | ............. C09K 11/06 |
| WO | WO-03/080760 A1 * | 10/2003 | ............. C09K 11/06 |
| WO | WO 2004/035709 * | 4/2004 | ............. C09K 11/06 |
| WO | WO 2004/094389 A1 | 11/2004 | |

OTHER PUBLICATIONS

Machine English translation of Matsuura et al. (JP 2004-071380 A). Dec. 23, 2013.*
Machine English translation of KR-10-2004-0094842. Apr. 15, 2015*
Japanese Office Action issued May 31, 2011, in Patent Application No. 2006-513528.

* cited by examiner

*Primary Examiner* — J. L. Yang
(74) *Attorney, Agent, or Firm* — Oblon, McClelland, Maier & Neustadt, L.L.P.

(57) ABSTRACT

Provided is an organic electroluminescence device having high luminous efficiency, high heat resistance and an extremely long lifetime. The organic electroluminescence device of the present invention includes an organic thin film layer composed of one or more layers containing at least a light emitting layer is interposed between a cathode and an anode. The light emitting layer includes a compound containing a condensed ring and a luminescent metal complex capable of emitting light having a red-based color. It is preferable that the compound containing a condensed ring includes a host material, while the luminescent metal complex capable of emitting light having a red-based color includes a phosphorescent dopant.

12 Claims, No Drawings

ORGANIC ELECTROLUMINESCENT DEVICE

TECHNICAL FIELD

The present invention relates to an organic electroluminescence (EL) device, in particular, an organic EL device having high luminous efficiency, high heat resistance, and an extremely long lifetime.

BACKGROUND ART

An organic EL device having an organic light emitting layer interposed between electrodes has been conventionally researched and developed in an intensive manner owing to, for example, the following reasons:
(1) the organic EL device can be easily handled and produced because it is a complete solid-state device;
(2) the organic EL device does not require any light emitting member because it can spontaneously emit light;
(3) the organic EL device is suitable for a display because it is excellent in visibility; and
(4) the organic EL device facilitates full colorization.

In general, a fluorescent emission phenomenon (luminescence phenomenon) as energy conversion occurring when a fluorescent molecule in a singlet excited state (which may hereinafter be referred to as the "S1 state") in an organic light emitting medium undergoes radiative transition to a ground state is used as the mechanism via which such organic EL device emits light. In addition, a fluorescent molecule in a triplet excited state (which may hereinafter be referred to as the "T1 state") is also assumed in the organic light emitting medium. However, such fluorescent molecule gradually undergoes non-radiative transition from the triplet excited state to any other state because its radiative transition to a ground state is forbidden transition. As a result, heat energy is released instead of the occurrence of fluorescent emission.

The terms "singlet" and "triplet" as used herein each refer to the multiplicity of energy determined by the number of combinations of the total spin angular momentum and total orbital angular momentum of a fluorescent molecule. That is, a singlet excited state is defined as an energy state in the case where a single electron is caused to undergo transition from a ground state with no unpaired electron to a higher energy level while the spin state of an electron remains unchanged. In addition, a triplet excited state is defined as an energy state in the case where a single electron is caused to undergo transition to a higher energy level while the spin state of an electron is reversed. Of course, light emission from the triplet excited state thus defined can be observed at an extremely low temperature such as the temperature at which liquid nitrogen liquefies (−196° C.). However, the temperature condition is not practical, and the quantity of emitted light is slight.

By the way, the total luminous efficiency of a conventional organic EL device is related to the efficiency ($\Phi rec$) with which injected charge carriers (an electron and a hole) recombine with each other and to the probability ($\Phi rad$) that a produced exciton causes radiative transition. Therefore, the total luminous efficiency ($\Phi el$) of an organic EL device is represented by the following equation.

$$\Phi e1 = \Phi rec \times 0.25 \Phi rad$$

Here, "0.25" of the coefficient for $\Phi rad$ in the equation is determined on the basis of the assumption that the probability for producing a singlet exciton is ¼. Therefore, a theoretical upper limit for the luminous efficiency of an organic EL device is 25% even when it is assumed that recombination and the radiation damping of an exciton each occur at a probability factor of 1. As described above, in the conventional organic EL device, no triplet exciton can be substantially utilized, and only a singlet exciton causes radiative transition, so there arises a problem in that an upper limit value for luminous efficiency is low. In view of the foregoing, attempts have been made to cause a fluorescent emission phenomenon to occur even under a room temperature condition through the transfer of energy from a produced triplet exciton to a phosphorescent dopant by utilizing a triplet exciton (triplet excited state) of an organic light emitting material (host material) (see, for example, Non-patent Document 1). To be more specific, it has been reported that a fluorescent emission phenomenon is caused by constituting an organic EL device including an organic light emitting layer constituted by 4,4-N,N-dicarbazolylbiphenyl and an Ir complex as a phosphorescent dopant.

Under such circumstances, research on a phosphorescent device utilizing a triplet exciton has been recently advanced. For example, Patent Documents 1 to 3 each disclose, as a host compound, a compound using a naphthyl group or an anthranyl group as a linking group for a carbazolyl group. In addition, Patent Document 4 discloses, as host compounds for a blue color, a specific group of compounds in each of which a triazine ring and a carbazolyl group couple with each other. However, the performance of each of organic EL devices using those compounds is not sufficient for practical use, and no compound containing a condensed ring such as a naphthyl group or an anthranyl group in any one of its molecules has been disclosed as a host material for red-based color phosphorescence.

Patent Document 1: JP-A-2001-072927
Patent Document 2: JP-A-2003-077674
Patent Document 3: JP-A-2003-031371
Patent Document 4: JP-A-2002-193952
Non Patent Document 1: Jpn. J. Appl. Phys., 38(1999) L1502

DISCLOSURE OF THE INVENTION

Problems to be Solved by the Invention

The present invention has been made with a view to solving the above problems, and an object of the present invention is to provide an organic EL device having high luminous efficiency, high heat resistance, and a long lifetime.

Means for Solving the Problems

The inventors of the present invention have made extensive studies with a view to achieving the above object. As a result, they have found that the use of a compound containing a condensed ring, which has not been acknowledged to be useful as a host material for phosphorescence, as a host material for a phosphorescent metal complex capable of emitting light having a red-based color enables red-based color fluorescent emission (including phosphorescent emission) to occur effectively through the utilization of a triplet exciton state and enables an organic EL device having a practical lifetime and excellent in luminous efficiency and heat resistance to be obtained, thereby completing the present invention.

That is, the present invention provides an organic electroluminescence device including an organic thin film layer composed of one or more layers containing at least a light emitting layer, the organic thin film layer being interposed between a cathode and an anode, in which the light emitting layer contains a compound containing a condensed ring and a luminescent metal complex capable of emitting light having a red-based color.

Effect of the Invention

The organic EL device of the present invention can cause red-based color fluorescent emission (including phosphorescent emission) to occur effectively through the utilization of a triplet exciton state, is excellent in luminous efficiency and heat resistance, has an extremely long lifetime, and is hence practical.

BEST MODE FOR CARRYING OUT THE INVENTION

An organic EL device of the present invention has an organic thin film layer composed of one or more layers including at least a light emitting layer, the organic thin film layer being interposed between a cathode and an anode. In the organic EL device, the light emitting layer contains a compound containing a condensed ring and a luminescent metal complex capable of emitting light having a red-based color.

In the present invention, the red-based color is preferably a yellow color, an orange color, a reddish orange color, or a red color, and the luminescent metal complex capable of emitting light having the red-based color preferably shows an emission spectrum having a peak wavelength in the range of 560 to 700 nm.

In the present invention, it is preferable that: the compound containing a condensed ring be a host material; and the luminescent metal complex capable of emitting light having the red-based color be a phosphorescent dopant. The reason for this is as follows: when the host material is the compound containing a condensed ring, a combination with the phosphorescent dopant enables the triplet exciton state of the compound containing a condensed ring to be effectively utilized even under a room temperature condition (20° C.). That is, the reason for the foregoing is that a fluorescent emission phenomenon can be caused by effectively transferring energy from a triplet state generated in the compound containing a condensed ring to the phosphorescent dopant.

In addition, the compound containing a condensed ring has a glass transition temperature of preferably 120° C. or higher, more preferably in the range of 120° C. to 190° C., or still more preferably in the range of 140° C. to 180° C. When the glass transition temperature is 120° C. or higher, crystallization hardly occurs upon combination with the phosphorescent dopant, a long lifetime is maintained, a short circuit hardly occurs in the case of energization under a high-temperature environmental condition, and the environment in which the organic EL device is used is not limited. In addition, when the glass transition temperature is 190° C. or lower, heat decomposition hardly occurs upon film formation by means of vapor deposition, so the device can be easily handled. It should be noted that the glass transition temperature (Tg) can be determined to be the point at which a specific heat changes obtained in the case of heating under, for example, a temperature increase condition of 10° C./min in a nitrogen circulation state by using a scanning calorimeter (DSC, differential scanning calorimetory).

In addition, in the organic EL device of the present invention, the triplet energy E1 of the compound containing a condensed ring in the light emitting layer and the triplet energy E2 of the phosphorescent dopant in the layer preferably satisfy the relationship of E1>E2. That is, a combination of the compound containing a condensed ring and the phosphorescent dopant in such triplet energy relationship enables the triplet exciton state of the compound containing a condensed ring to be surely utilized even under a room temperature condition. That is, a fluorescent emission phenomenon can be caused by surely transferring energy from a triplet state generated in the compound containing a condensed ring to the phosphorescent dopant.

The condensed ring group included in the compound containing a condensed ring of the present invention preferably includes 6 to 50 ring carbon atoms. Examples of the condensed ring group include a naphthyl group, an anthranyl group, a phenanthryl group, a pyrenyl group, a colonyl group, a benzothiophenyl group, an oxadiazolyl group, a diphenylanthranyl group, an indolyl group, a benzoquinolyl group, a fluorenyl group, a bisfluorenyl group, a pyrazolyl group, an imidazolyl group, a pyradinyl group, a pyrimidinyl group, an indazolyl group, a purinyl group, a phtharadinyl group, a naphtylidinyl group, a quinoxalinyl group, a quinazolinyl group, a cinnolinyl group, a pteridinyl group, a perimidinyl group, a phenanthrolyl group, a pyrroloimidazolyl group, a pyrrolotriazolyl group, a pyrazoloimidazolyl group, a pyrazolotriazolyl group, a pyrazolopyrimidinyl group, a pyrazolotriazinyl group, an imidazoimidazolyl group, an imidazopyridazinyl group, an imidazopyridinyl group, an imidazopyradinyl group, a triazolopyridinyl group, a benzoimidazolyl group, a naphthoimidazolyl group, a benzoxazolyl group, a naphthoxazolyl group, a benzothiazolyl group, a naphthothiazolyl group, a benzotriazolyl group, a tetrazaindenyl group, and triazinyl group. Of those, a naphthyl group, a phenanthryl group, and a fluorenyl group are preferable, and a naphthyl group is more preferable.

Further, a compound having an aromatic heterocyclic group having one or more hetero atoms is preferably used as the compound containing a condensed ring.

The aromatic heterocyclic group preferably includes a five-membered ring or six-membered ring. Examples of those aromatic heterocyclic groups include residues such as pyrazole, imidazole, pyrazine, pyrimidine, indazole, purine, phthalazine, naphthylizine, quinoxaline, quinazoline, cinnoline, pteridine, perimidine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyradine, triazolopyridine, benzoimidazole, naphthoimidazole, benzoxazole, naphthoxazole, benzothiazole, naphthothiazole, benzotriazole, tetrazaindene, triazine, and carbazole. Of those, a residue of pyrimidine is preferable. Further, a bonding position of those aromatic heterocyclic rings may be a condensed portion or a non-condensed portion.

In addition, the condensed ring group may have any one of various substituents. Examples of those substituents include: a substituted or unsubstituted aryl group having 6 to 50 ring carbon atoms; a substituted or unsubstituted aromatic heterocyclic group having 3 to 50 ring atoms; a substituted or unsubstituted alkyl group having 1 to 50 carbon atoms; a substituted or unsubstituted alkoxy group having 1 to 50 carbon atoms; a substituted or unsubstituted aralkyl group having 7 to 50 carbon atoms; a substituted or unsubstituted aryloxy group having 5 to 50 ring atoms; a substituted or unsubstituted arylthio group having 5 to 50 ring atoms; a substituted or unsubstituted carbonyl group having 1 to 50 carbon atoms; a carboxyl group; a halogen group; a cyano group; a nitro group; and a hydroxyl group. They may bond to each other to form a ring structure.

The compound containing a condensed ring to be used in the present invention is preferably a compound represented by the following general formula (1) and/or the following general formula (2):

(Cz-L)$_m$-FA (1)

(Cz)$_n$-L-FA (2)

where:

Cz represents any one of carbazolyl groups or indolyl groups represented by any one of the following general formulae (3) to (8);

L represents a single bond, or anyone of an aromatic hydrocarbon cyclic group having 6 to 50 ring carbon atoms, a heterocyclic group having 2 to 50 ring carbon atoms, an aryl-substituted heterocyclic group having 2 to 50 ring carbon atoms, a diaryl-substituted heterocyclic group having 2 to 50 ring carbon atoms, and a triaryl-substituted heterocyclic group having 2 to 50 ring carbon atoms, each of these groups being permitted to have a substituent, and, when multiple Ls are present, Ls may be identical to or different from each other;

m and n each represent an integer of 0 to 10, preferably 1 to 10, or more preferably 1 to 5; and FA represents a substituted or unsubstituted condensed ring group having 6 to 50 ring carbon atoms provided that FA never represents an unsubstituted carbazolyl group.

Examples of the condensed ring group represented by FA in each of the general formulae (1) and (2) are similar to those described above.

In the general formulae (1) and (2), examples of the aromatic hydrocarbon ring group represented by L include residues such as benzene, naphthalene, anthracene, naphthacene, pyrene, chrysene, biphenyl, triphenylene, fluorene, and bisfluorene.

Examples of the heterocyclic group represented by L include residues such as pyrazole, imidazole, pyrazine, pyrimidine, indazole, purine, phthalazine, naphthylidine, quinoxaline, quinazoline, cinnoline, pteridine, perimidine, phenanthroline, pyrroloimdazole, pyrrolotriazole, pyrazoloimidazole, pyrazolotriazole, pyrazolopyrimidine, pyrazolotriazine, imidazoimidazole, imidazopyridazine, imidazopyridine, imidazopyradine, triazolopyridine, benzoimidazole, naphthoimidazole, benzoxazole, naphthoxazole, benzothiazole, naphthothiazole, benzotriazole, tetrazaindene, triazine, and carbazole.

Examples of the aryl-substituted heterocyclic group, diaryl-substituted heterocyclic group, or triaryl-substituted heterocyclic group represented by L include those obtained by substituting the above heterocyclic groups by the above aromatic hydrocarbon cyclic groups.

Cz in each of the general formulae (1) and (2) is represented by any one of the following general formulae (3) to (8).

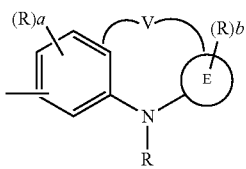

In the general formulae (3) to (8), a and b each represent an integer of 0 to 4.

In the general formulae (3) to (8), R represents an aryl group which has 6 to 50 ring carbon atoms and which may have a substituent, a heterocyclic group which has 5 to 50 ring atoms and which may have a substituent, an alkyl group which has 1 to 50 carbon atoms and which may have a substituent, an alkoxy group which has 1 to 50 carbon atoms and which may have a substituent, an aralkyl group which has 7 to 50 ring carbon atoms and which may have a substituent, an aryloxy group which has 5 to 50 ring carbon atoms and which may have a substituent, an arylthio group which has 5 to 50 ring carbon atoms and which may have a substituent, a carboxyl group, a halogen atom, a cyano group, a nitro group, or a hydroxyl group, and, when multiple Rs are present, they may bond to each other to form a ring structure.

Examples of the aryl group represented by R include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, a m-terphenyl-3-yl group, a m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Examples of the heterocyclic group represented by R include a 1-pyrolyl group, a 2-pyrolyl group, a 3-pyrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenadinyl group, a 2-phenadinyl group, a 1-phenothiadinyl group, a 2-phenothiadinyl group, a 3-phenothiadinyl group, a 4-phenothiadinyl group, a 10-phenothiadinyl group, a 1-phenoxadinyl group, a 2-phenoxadinyl group, a 3-phenoxadinyl group, a 4-phenoxadinyl group, a 10-phenoxadinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

Further, examples of the heterocyclic group represented by R include: a group in which 1 to 10 benzene rings are bound such as a biphenyl group and a terphenyl group; and a group having a condensed ring such as a naphthyl group, an anthranyl group, a phenanthryl group, a pyrenyl group, and a colonyl group. Of those, a group in which 2 to 5 benzene rings are bound and having many meta bindings which generate deformation under torsion of a molecule is particularly preferable.

Examples of the alkyl group represented by R include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, a cyclopropyl group, a cyclobutyl group, a cyclopentyl group, a cyclohexyl group, and a 4-methylcyclohexyl group.

The alkoxy group represented by R is represented by —OY, and examples of Y are similar to those of the alkyl group.

The aryloxy group represented by R is represented by —OY', and examples of Y' are similar to those of the aryl group.

The arylthio group represented by R is represented by —SY', and examples of Y' are similar to those of the aryl group.

Examples of the aralkyl group represented by R include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, a m-methylbenzyl group, an o-methylbenzyl group, a p-chlorobenzyl group, a m-chlorobenzyl group, an o-chlorobenzyl group, a p-bromobenzyl group, a m-bromobenzyl group, an o-bromobenzyl group, a p-iodobenzyl group, a m-iodobenzyl group, an o-iodobenzyl group, a p-hydroxybenzyl group, a m-hydroxybenzyl group, an o-hydroxybenzyl group, a p-aminobenzyl group, a m-aminobenzyl group, an o-aminobenzyl group, a p-nitrobenzyl group, a m-nitrobenzyl group, an o-nitrobenzyl group, a p-cyanobenzyl group, a m-cyanobenzyl group, an o-cyanobenzyl group, a 1-hydroxy-2-phenylisopropyl group, and a 1-chloro-2-phenylisopropyl group.

Further, examples of the substituent of the each group include a halogen atom, a hydroxyl group, an amino group, a nitro group, a cyano group, an alkyl group, an alkenyl group, a cycloalkyl group, an alkoxy group, an aryl group, a heterocyclic group, an aralkyl group, an aryloxy group, an alkoxycarbonyl group, and a carboxyl group.

In the general formulae (3) to (8), V represents a single bond, —$CR_0R_0'$—, —$SiR_0R_0'$—, —O—, —CO—, or —$NR_0$ where $R_0$ and $R_0'$ each independently represent a hydrogen atom, an aryl group which has 6 to 50 ring carbon atoms and which may have a substituent, a heterocyclic group which has 5 to 50 ring atoms and which may have a substituent, or an alkyl group which has 1 to 50 carbon atoms and which may have a substituent.

Examples of the aryl group, heterocyclic group, or alkyl group represented by any one of $R_0$ and $R_0'$ are similar to those described above for R.

In the general formulae (3) to (8), E represents a cyclic structure represented by a circle surrounding the symbol E, and represents a cycloalkane residue which has 3 to 20 ring carbon atoms and which may have a substituent, and a carbon atom of which may be substituted by a nitrogen atom, an aromatic hydrocarbon group which has 4 to 50 ring carbon atoms and which may have a substituent, or a heterocyclic group which has 4 to 50 ring atoms and which may have a substituent.

Specific examples of the aromatic hydrocarbon group and the heterocyclic group each represented by E include divalent residues selected from the examples of L in the general formulae (1) and (2), the carbon number of each of which is adaptable to that of E. In addition, examples of the cycloalkane residue which has 3 to 20 ring carbon atoms and a carbon atom of which may be substituted by a nitrogen atom include divalent residues of cyclopropane, cyclobutane, cyclopropane, cyclohexane, cycloheptane, pyrrolidine, piperidine, piperazine, and the like.

Examples of the general formula (3) include structures represented by the following general formulae (9) to (12) (the same structures can be exemplified for the general formula (4)):

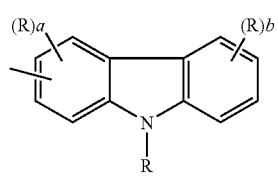
(9)

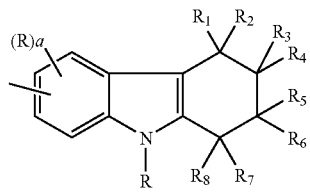
(10)

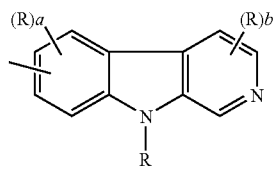
(11)

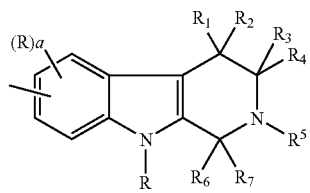
(12)

where a, b, and R each have the same meaning as that described above, and $R_1$ to $R_8$ each have the same meaning as that of R.

Furthermore, specific examples of the general formulae (9) to (12) include the following structures. It should be noted that Me represents a methyl group.

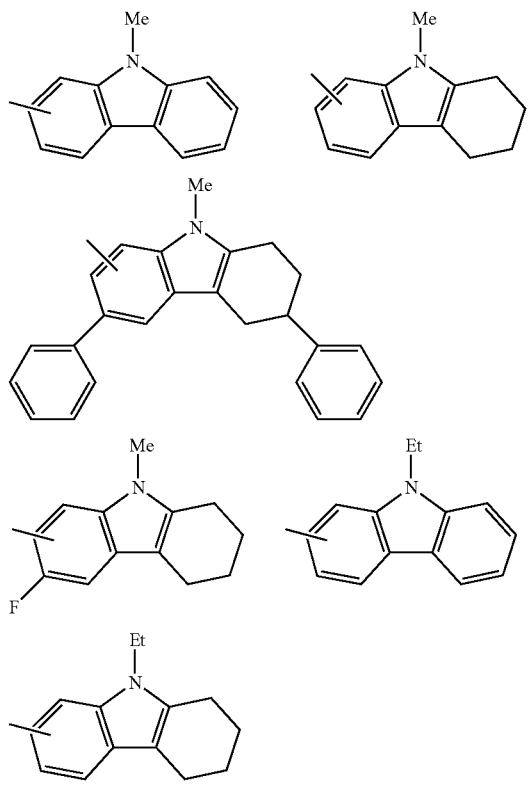

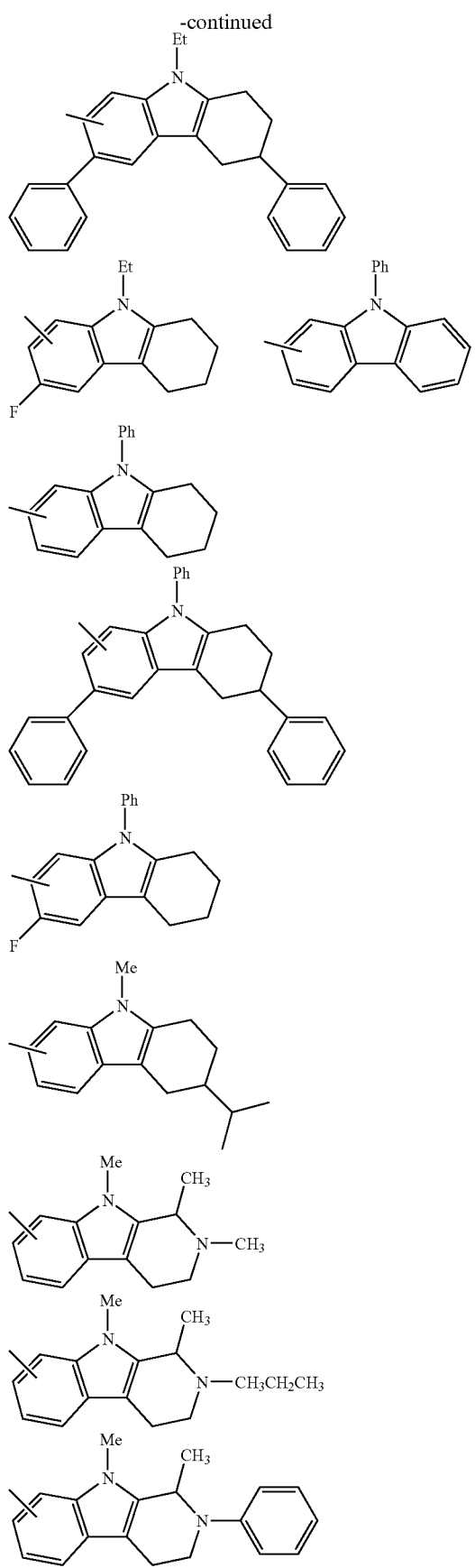
Examples of the general formula (5) include structures represented by the following general formulae (13) to (16):
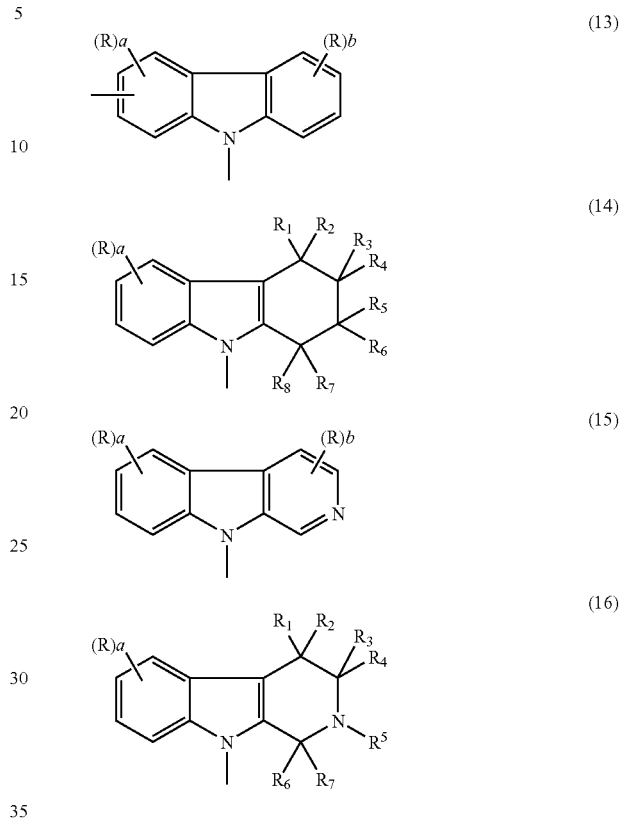
where a, b, R, and $R_1$ to $R_8$ each have the same meaning as that described above.
Furthermore, specific examples of the general formulae (13) to (16) include the following structures.
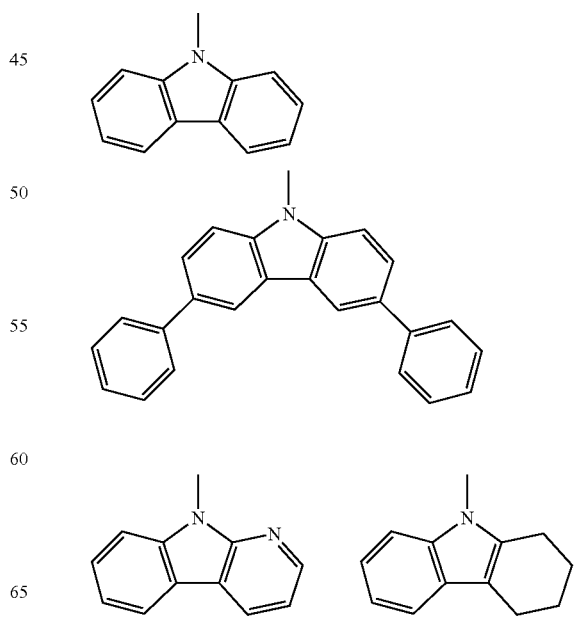

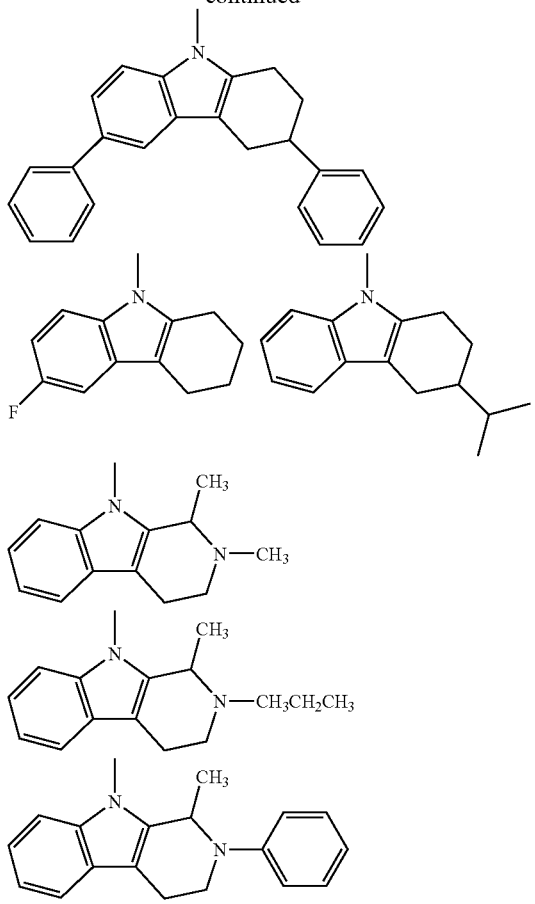

Specific examples of the general formula (6) include the following structures (the same structures can be exemplified for the general formula (7)).

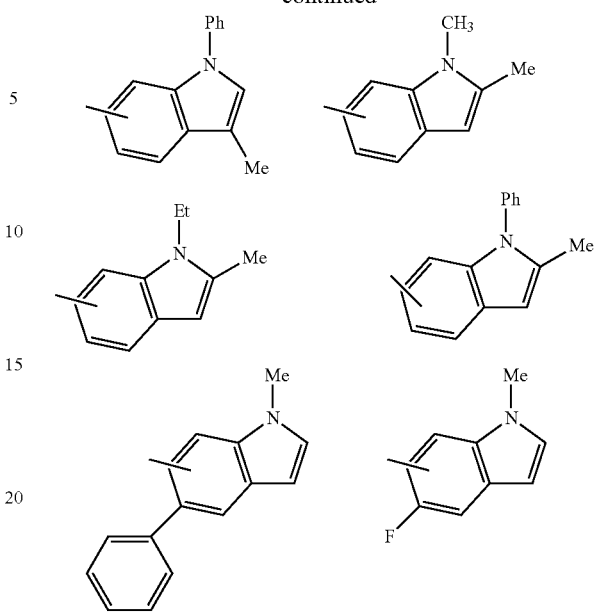

Specific examples of the general formula (8) include the following structures.

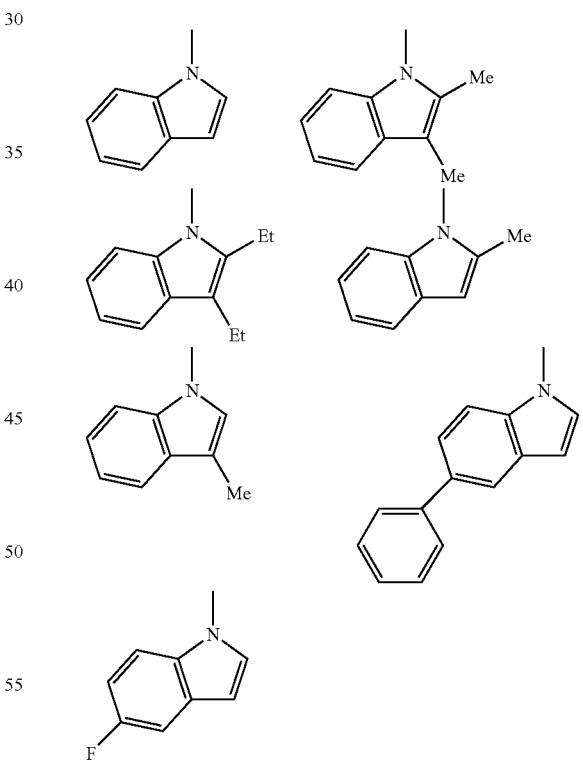

The compound containing a condensed ring to be used in the present invention and represented by any one of the formulae (1) and (2) particularly preferably has any one of such structures as shown below:

Cz-L-Na, Cz-L-(Na)$_2$, Cz-L-Na-L-Cz, Cz-L-Na-L'-Na, Cz-L-Het-Na, Cz-L-Het-(Na)$_2$, Cz-L-Na-Het, Na-L-Het, Het-L-Na-L-Het where Cz and L each have the same meaning as that described above, L' has the same meaning as that of L described above and is of a kind different from that of L shown here, Na represents a naphthyl group, and Het represents a heterocyclic group.

Specific examples of the compound containing a condensed ring to be used in the present invention and represented by any one of the general formulae (1) and (2) are shown below. However, the examples are not limited to these exemplified compounds.

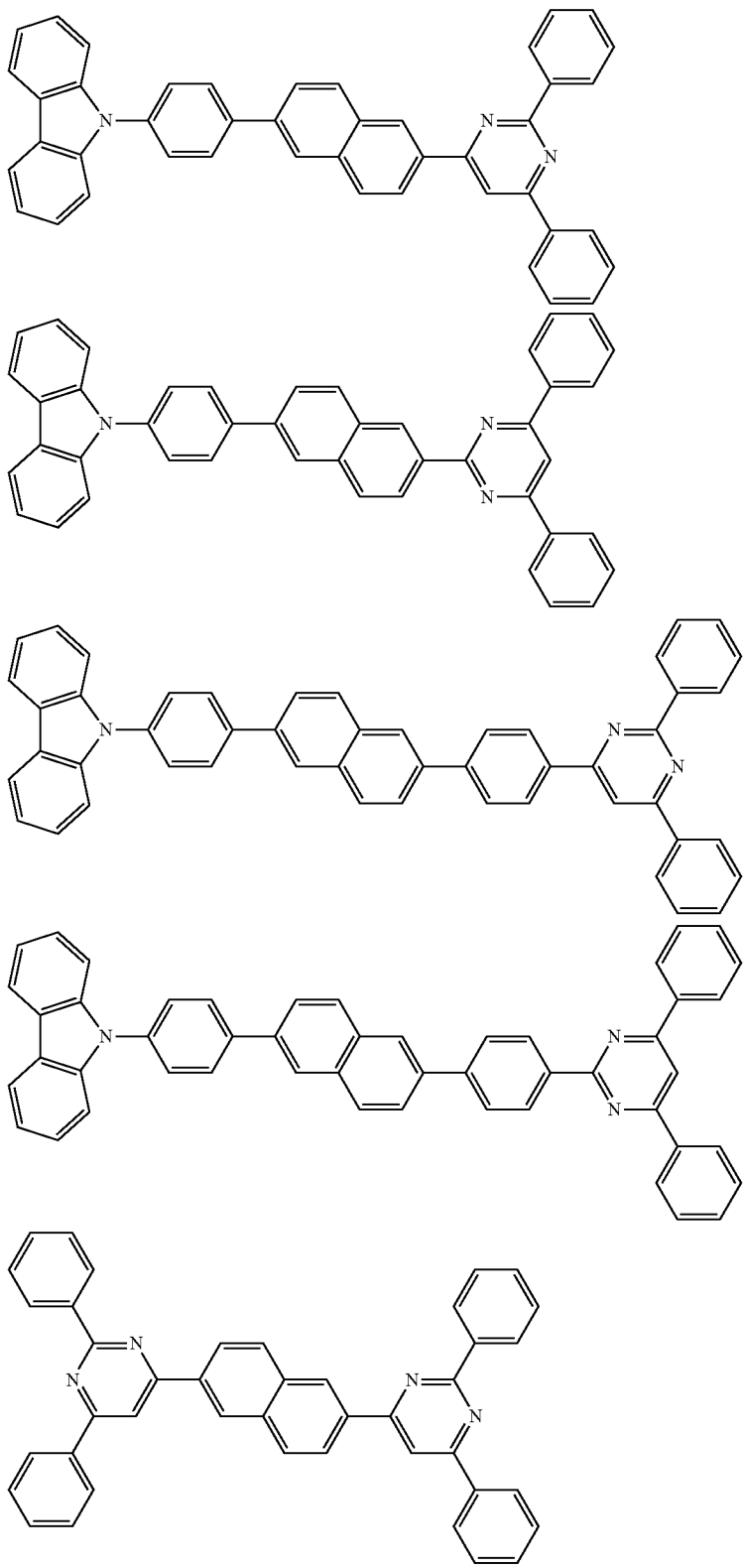

-continued
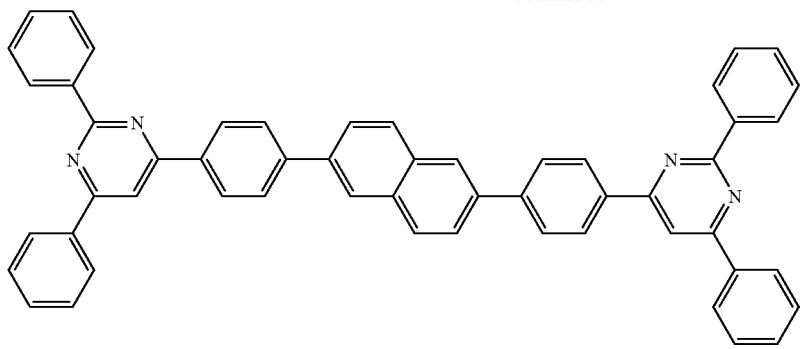
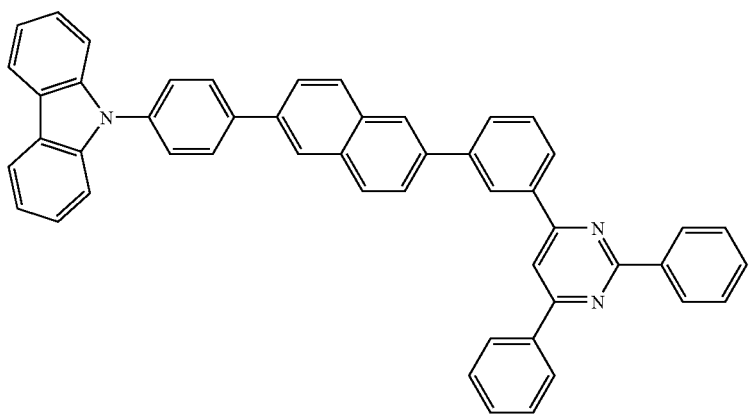
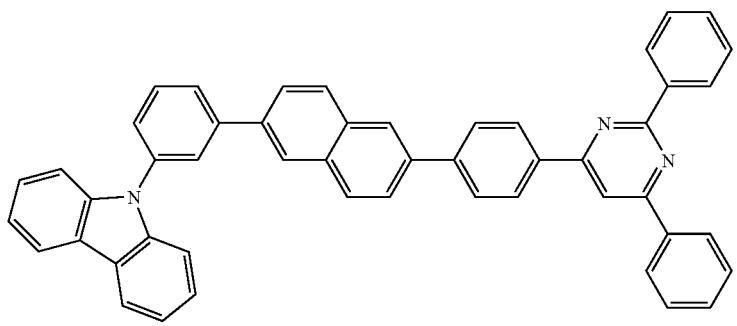
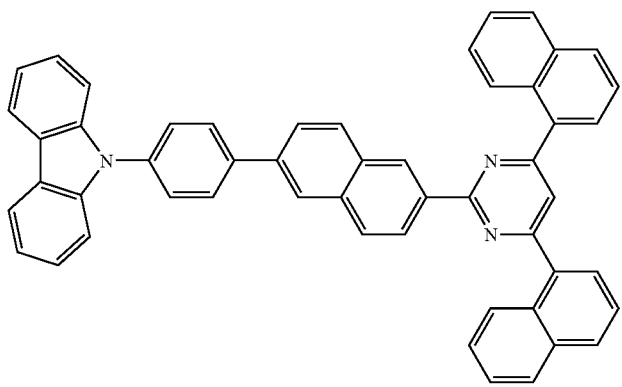

-continued
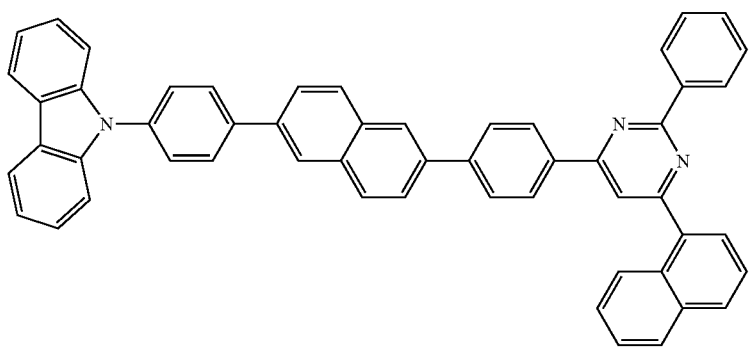
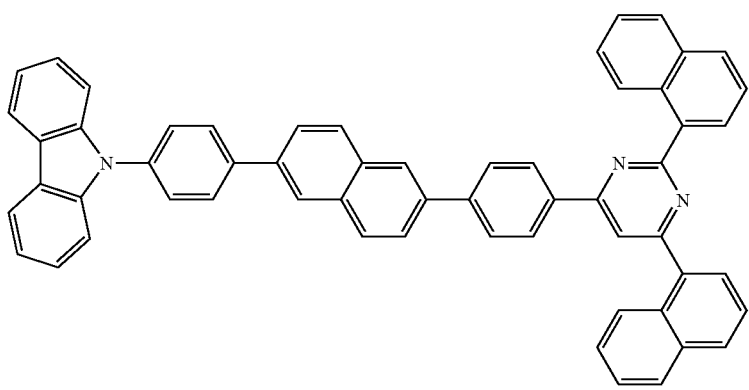
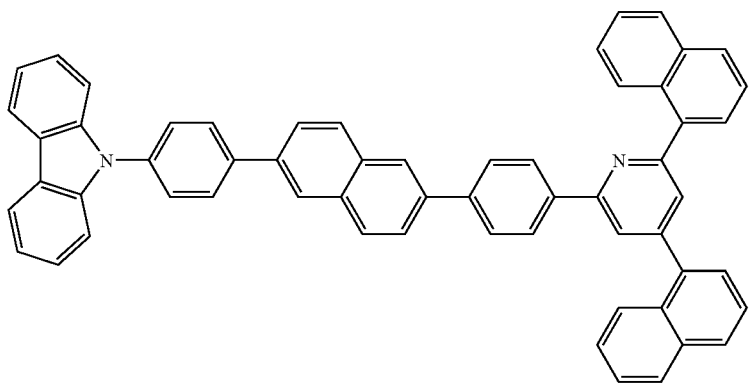
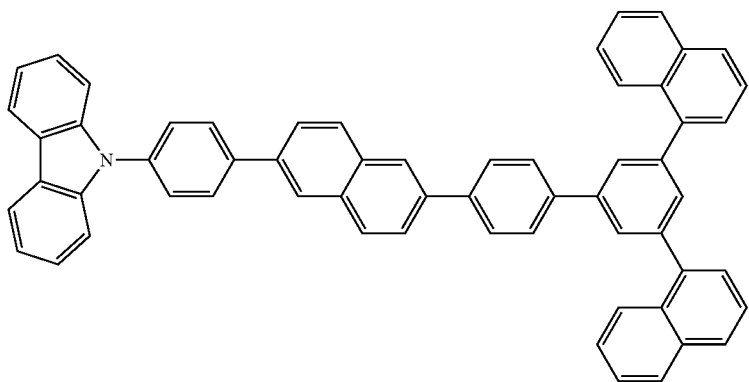

-continued
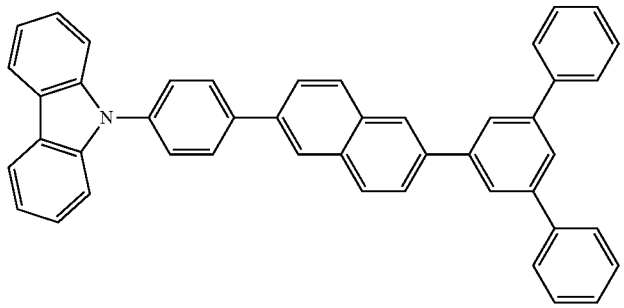
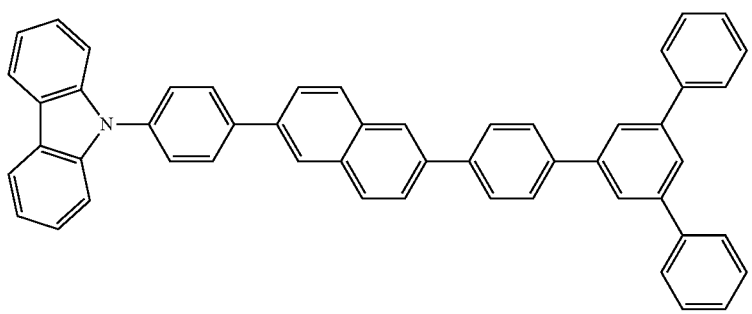
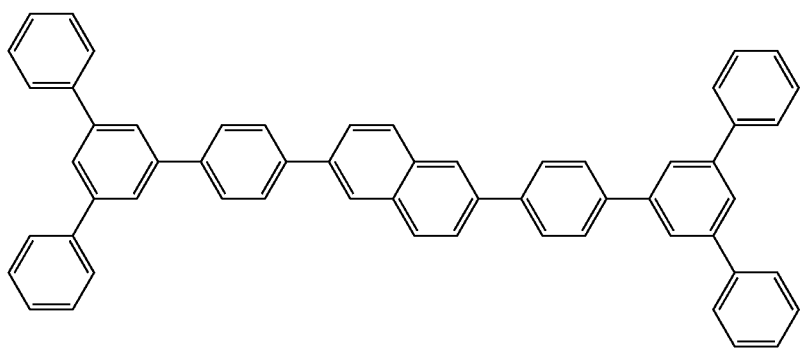
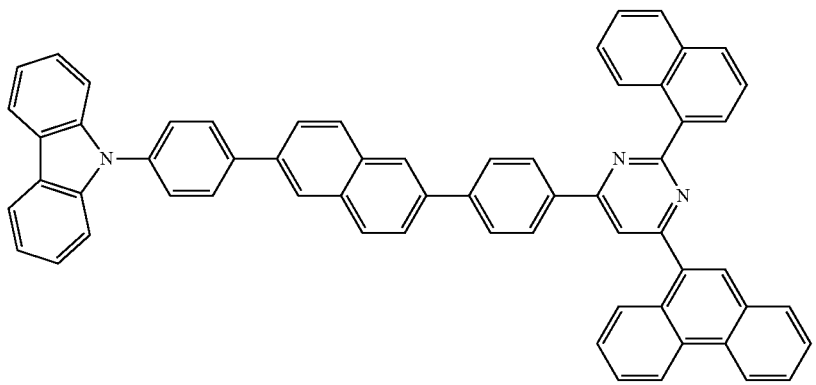
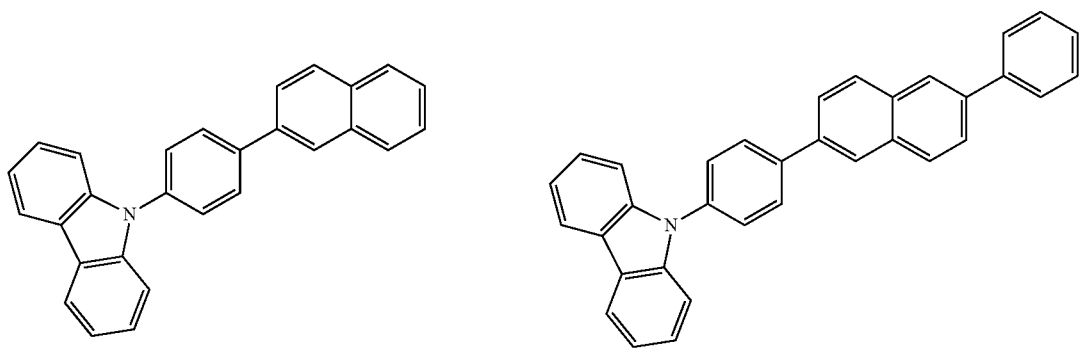

-continued
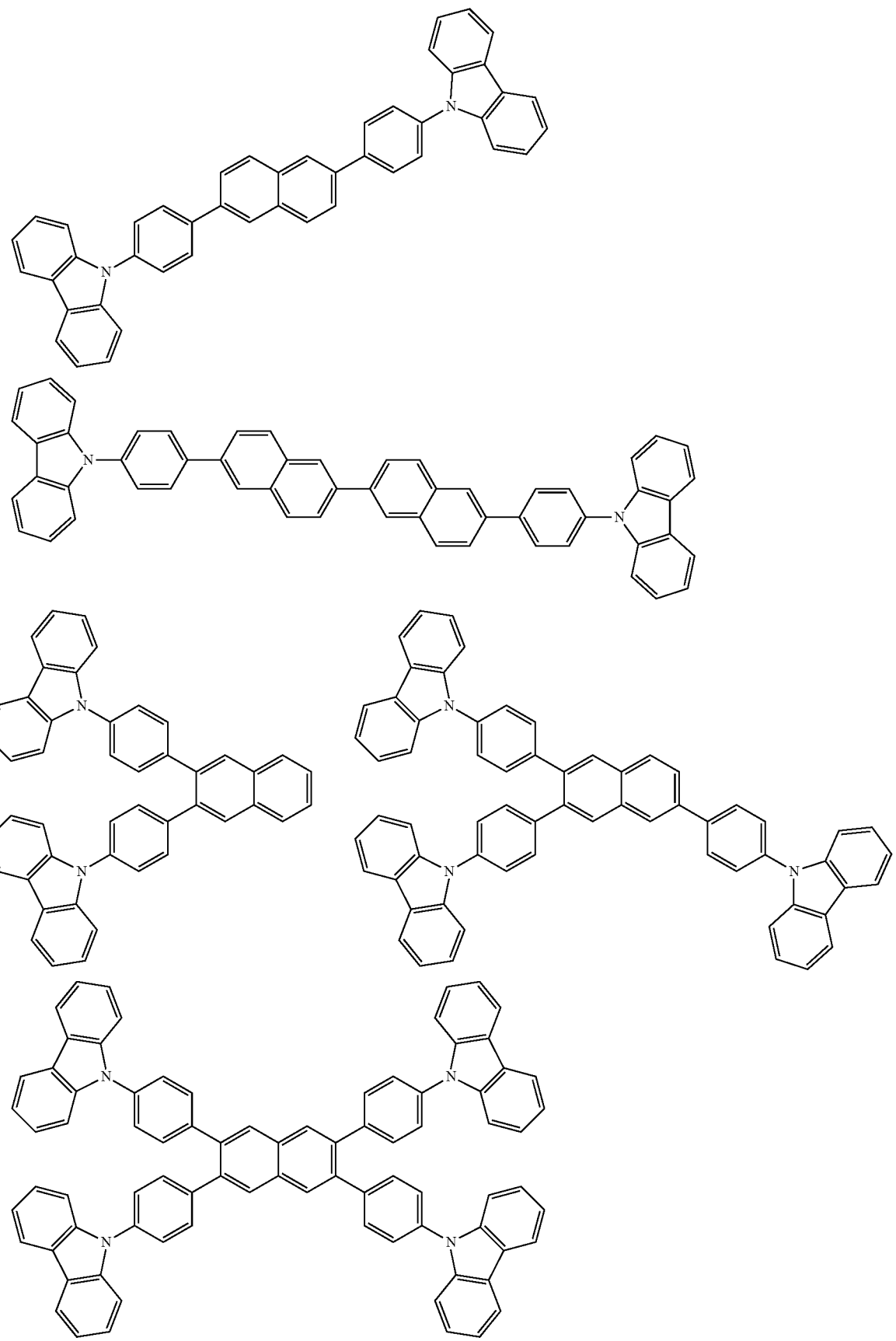

-continued
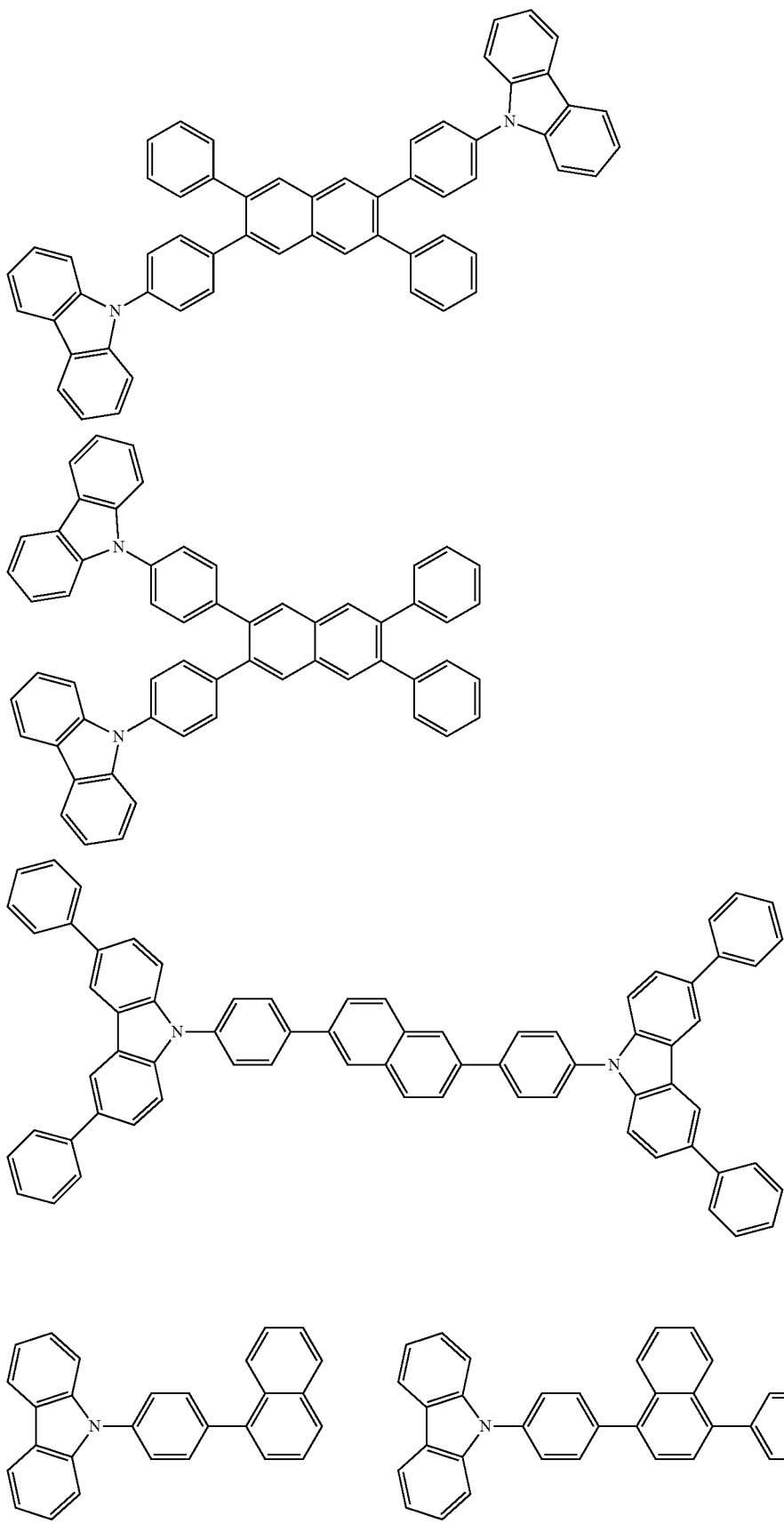

-continued
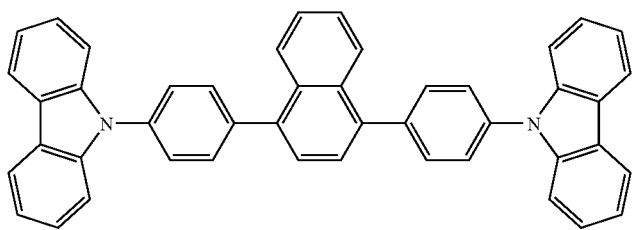
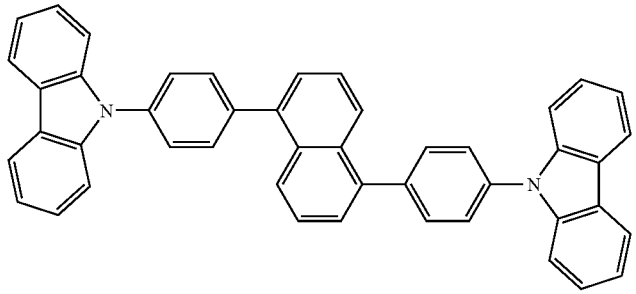
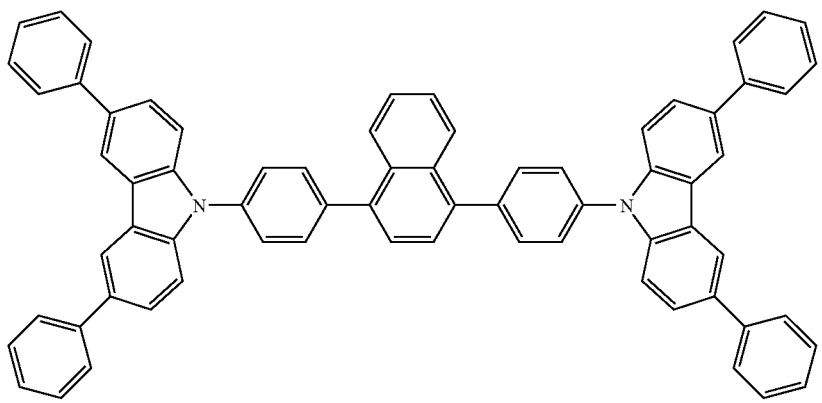
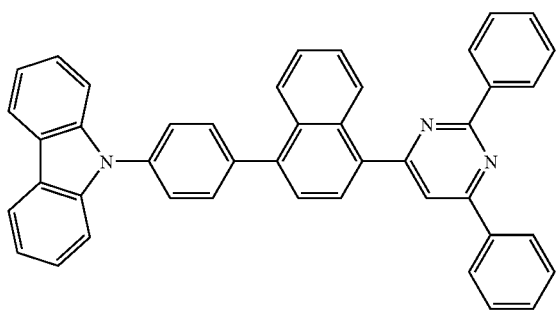
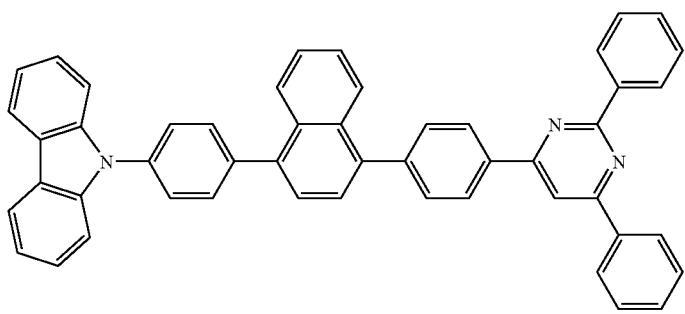

-continued
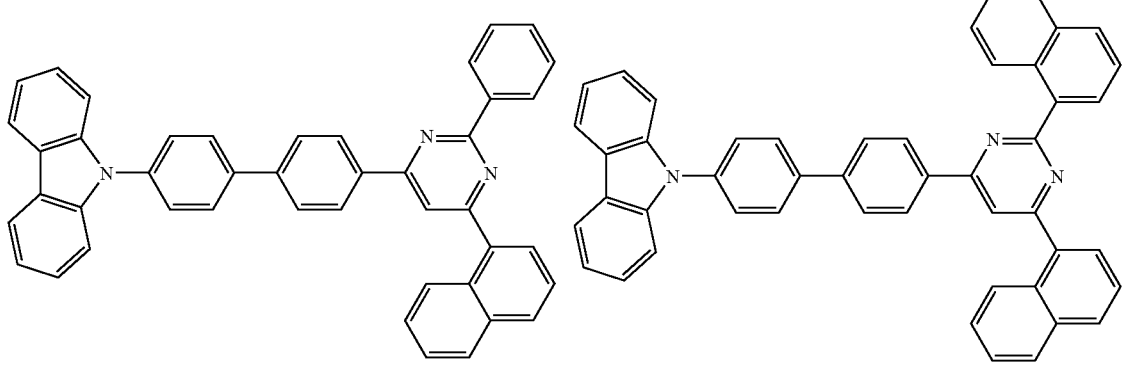
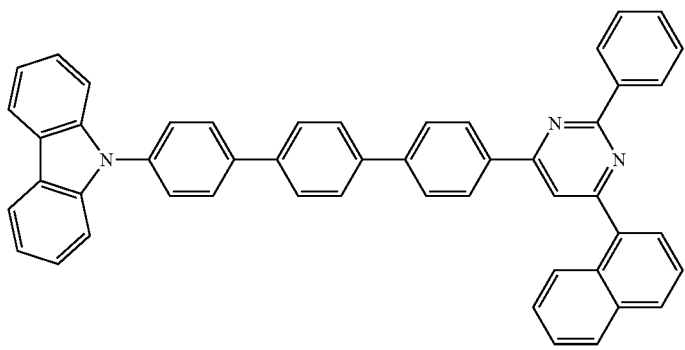
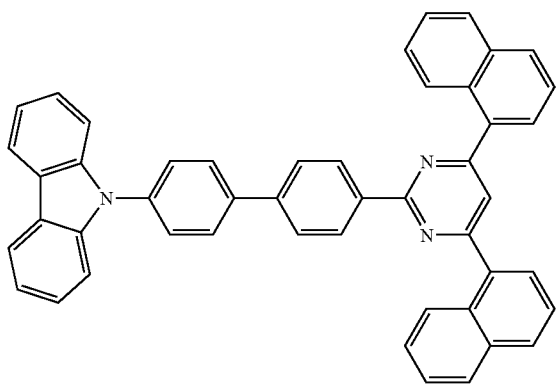
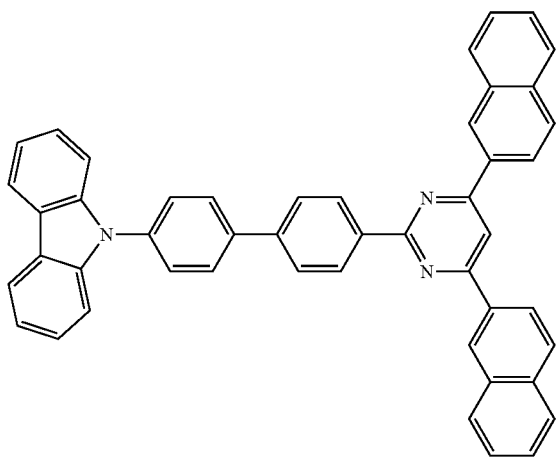

-continued
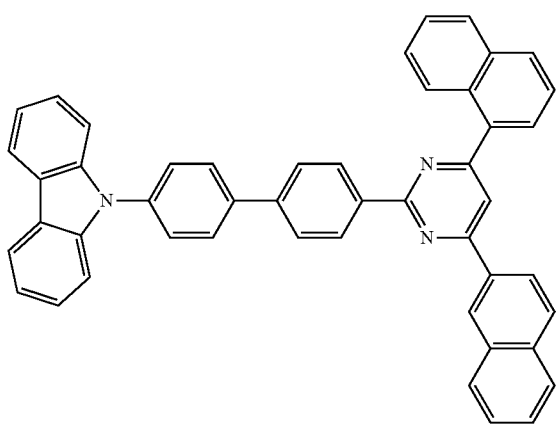
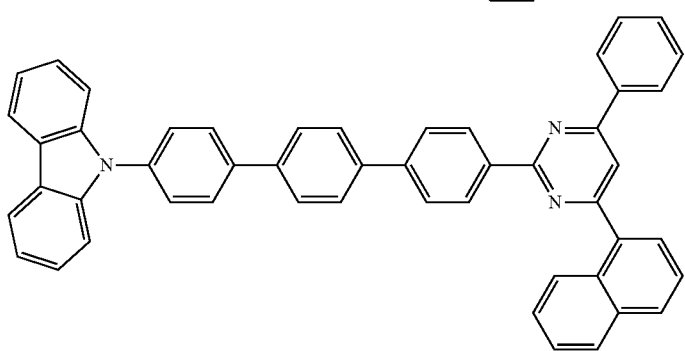
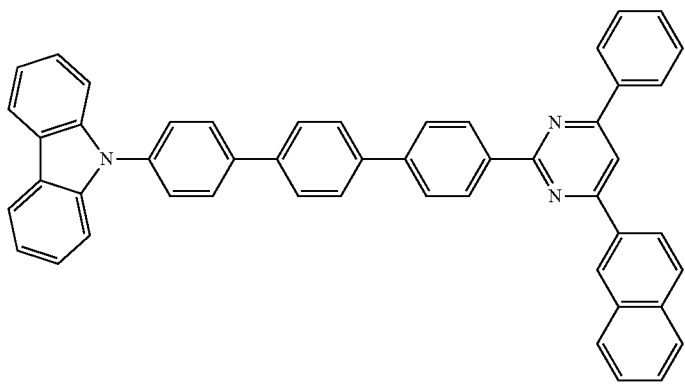
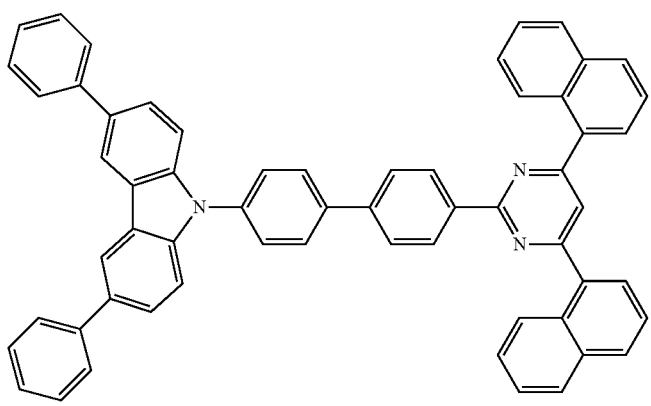

-continued
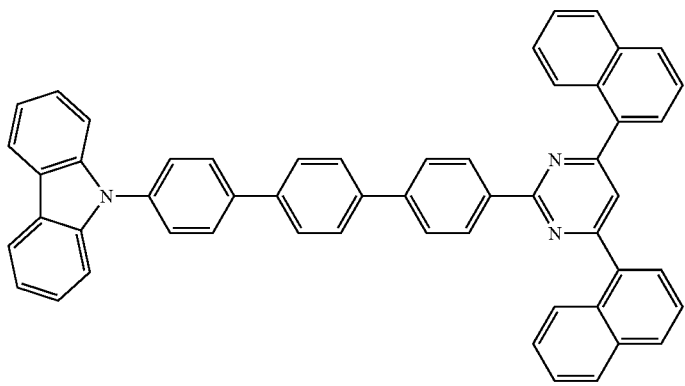
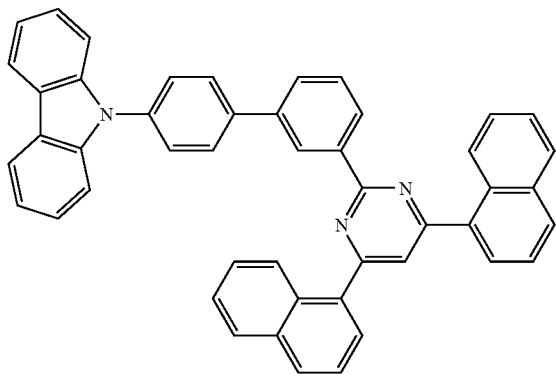
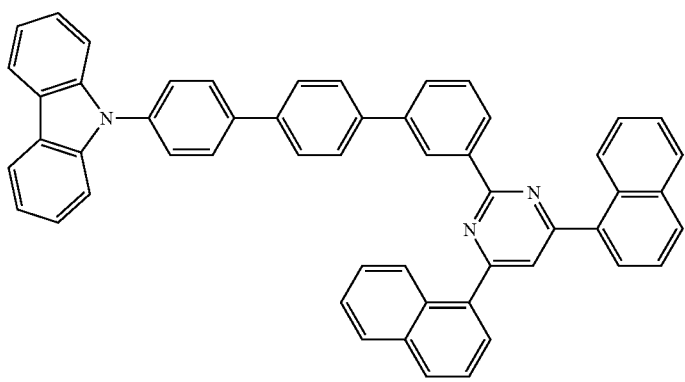
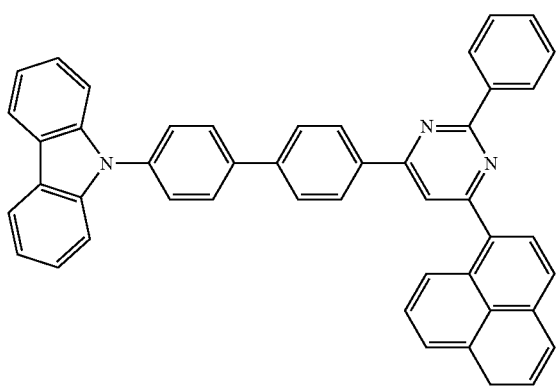

-continued
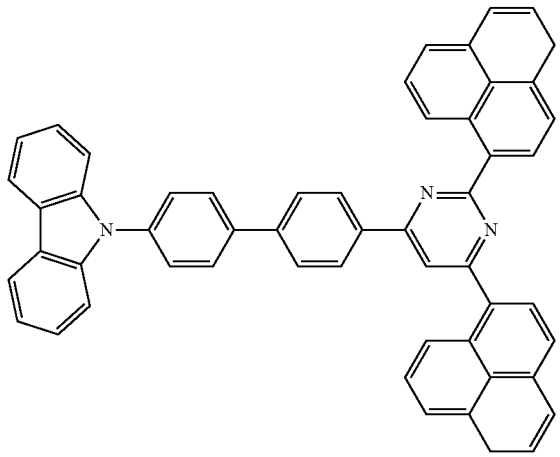
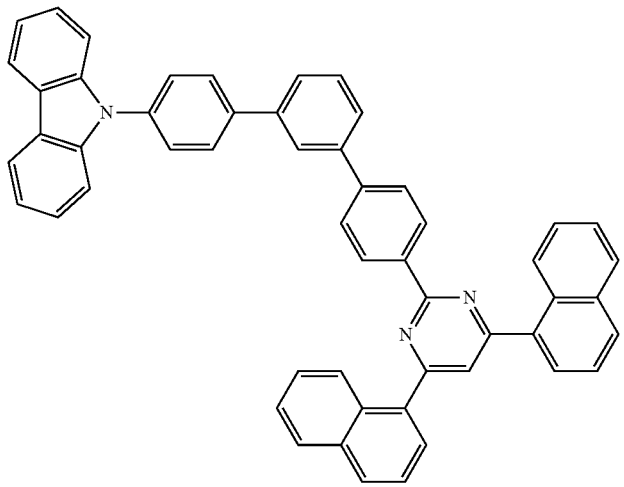 [SMILES: c1cc(-c2ccc(-c3nc(-c4cccc5ccccc45)cc(-c4cccc5ccccc45)n3)cc2)cc(-c2ccc(-n3c4ccccc4c4ccccc43)cc2)c1]
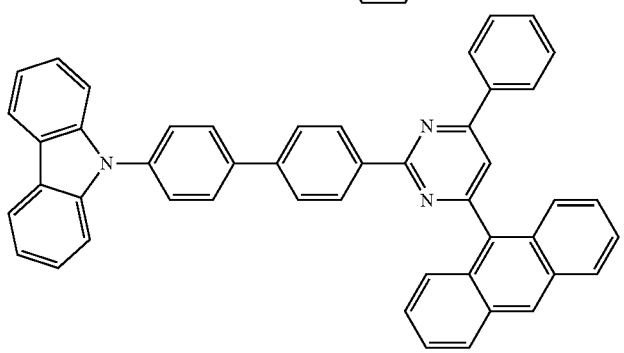
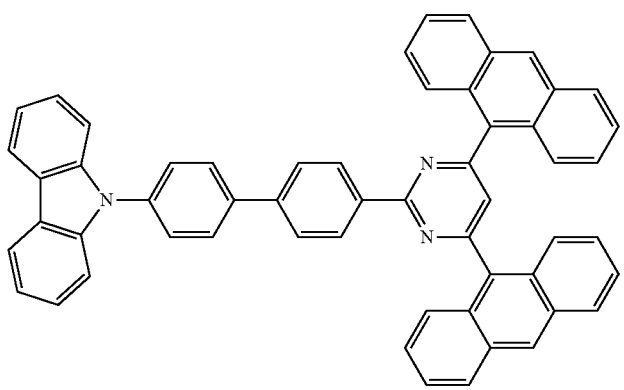

-continued
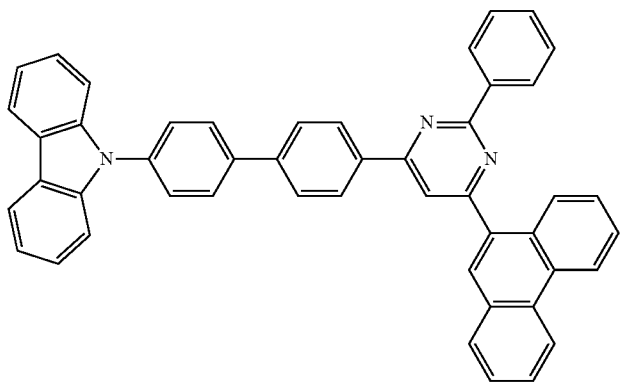
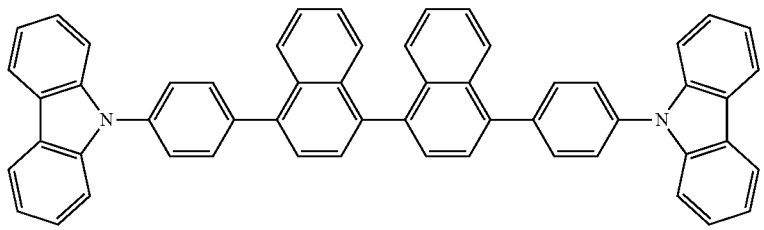
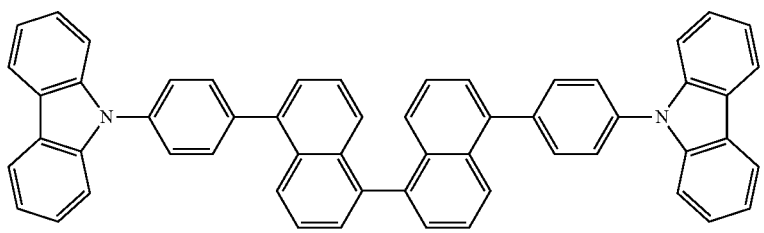
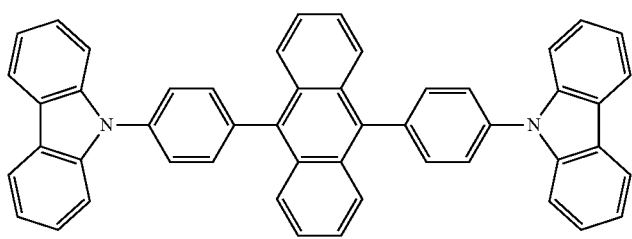
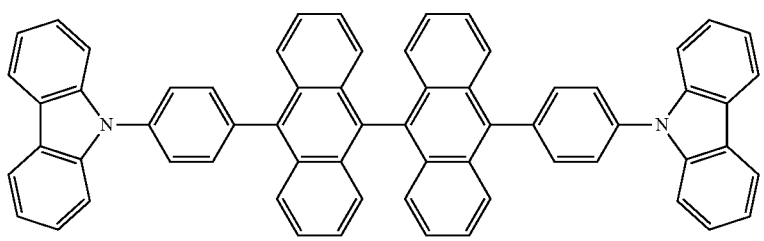
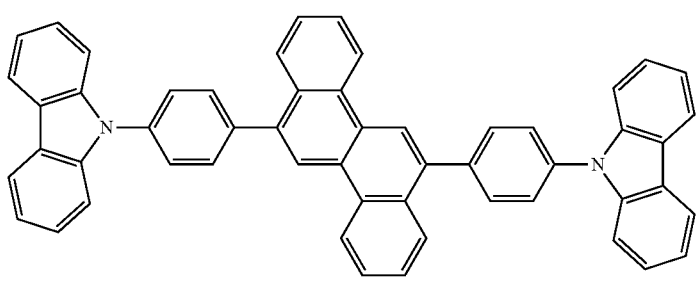

-continued
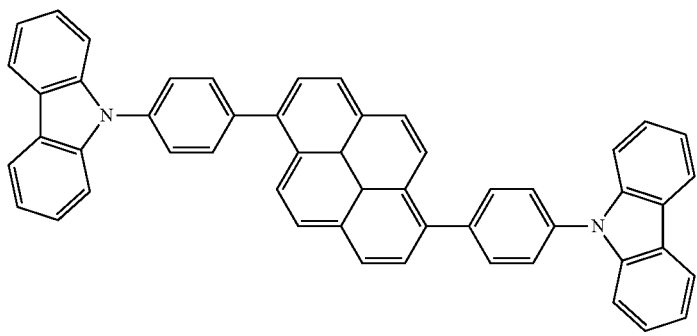
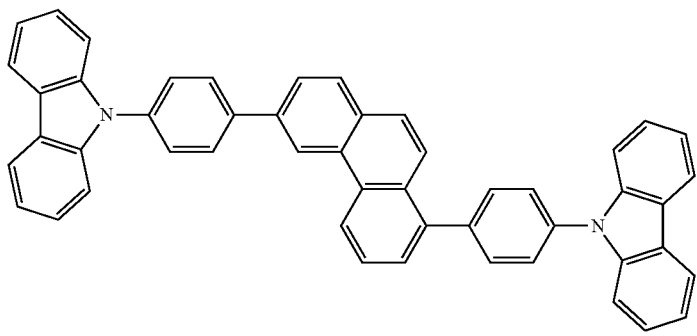
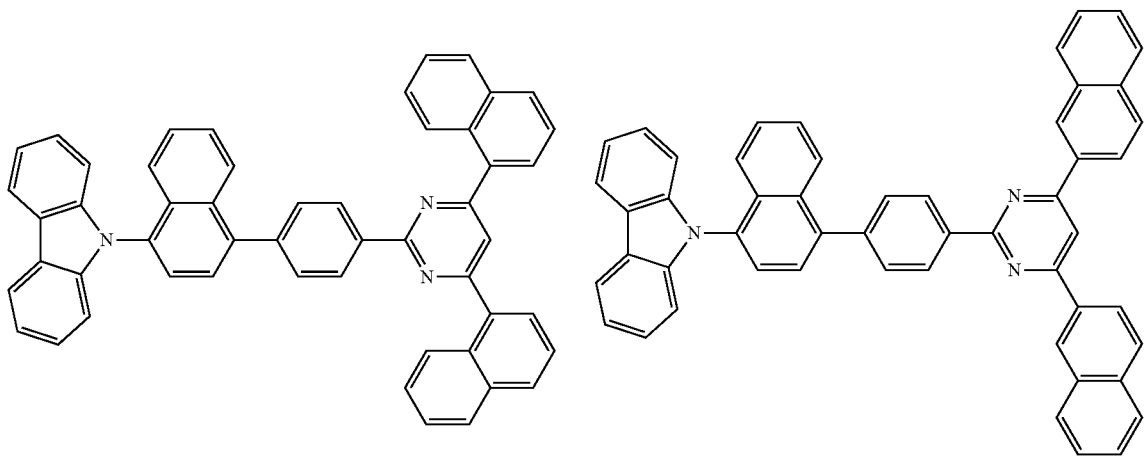
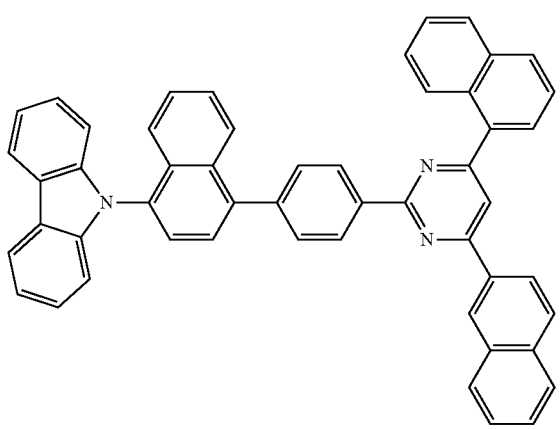

-continued
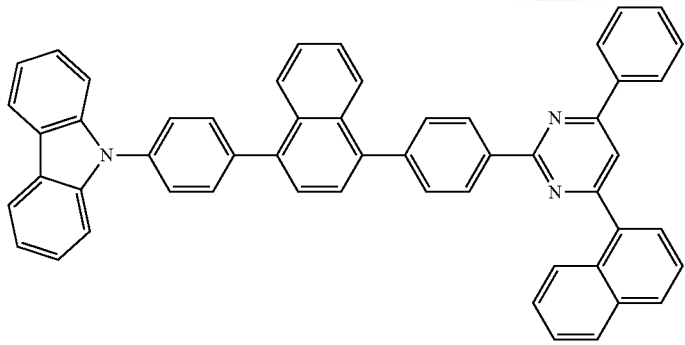
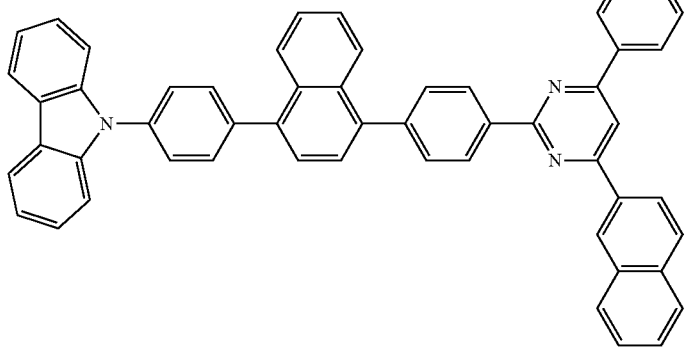
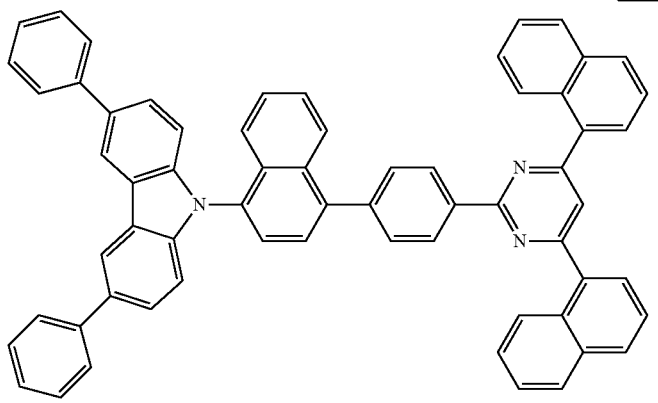
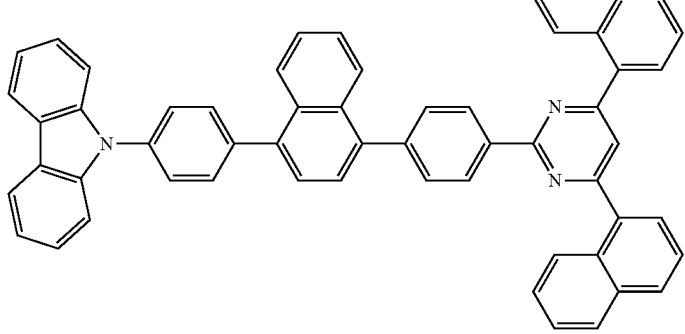
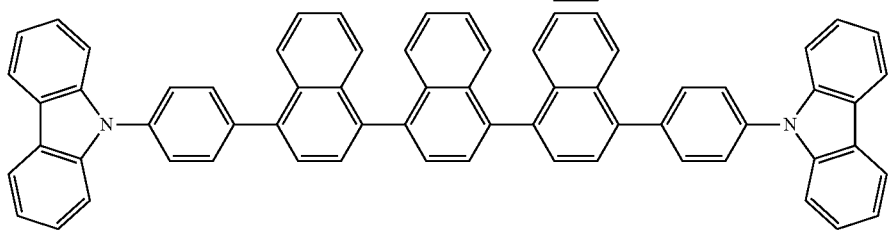

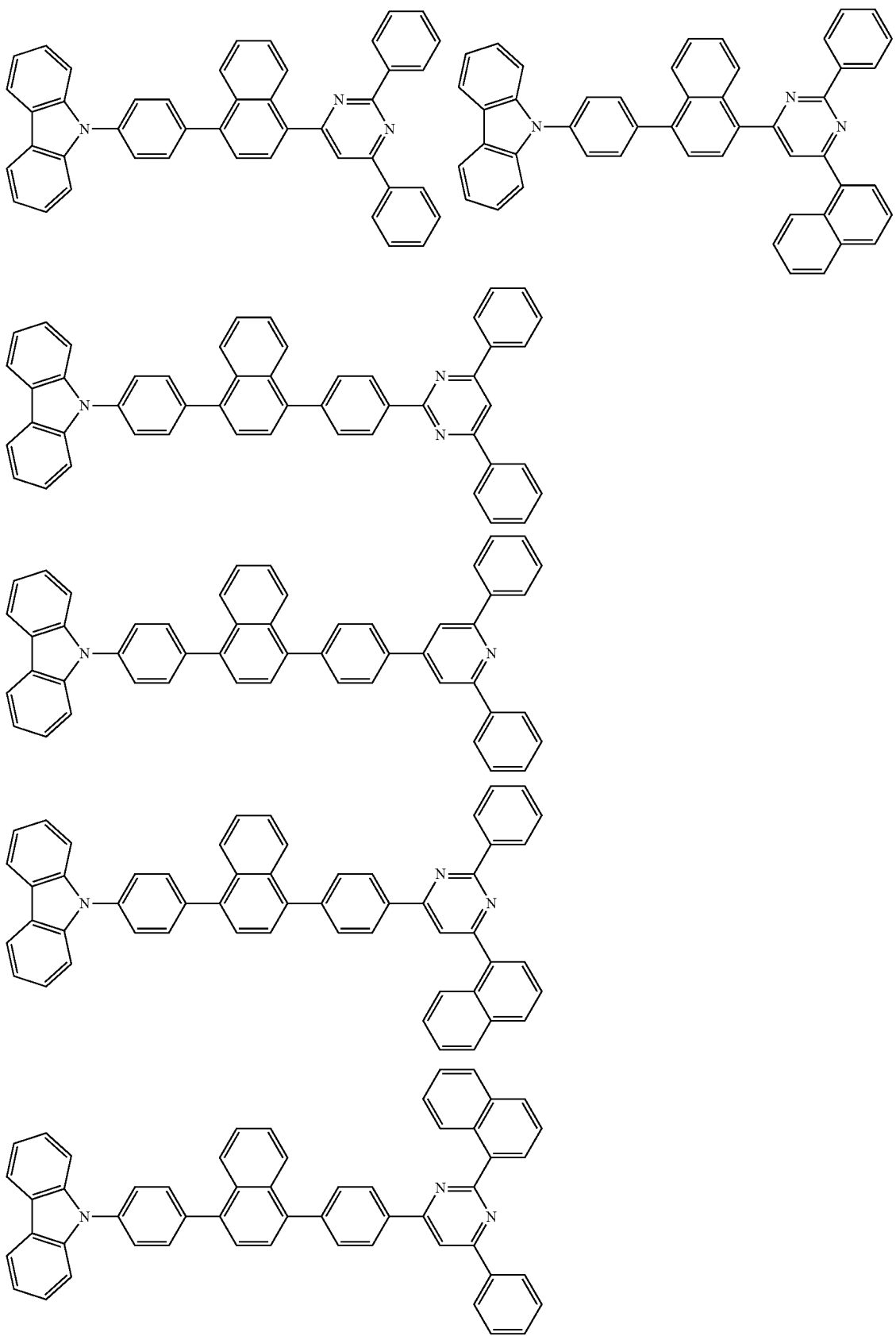

-continued
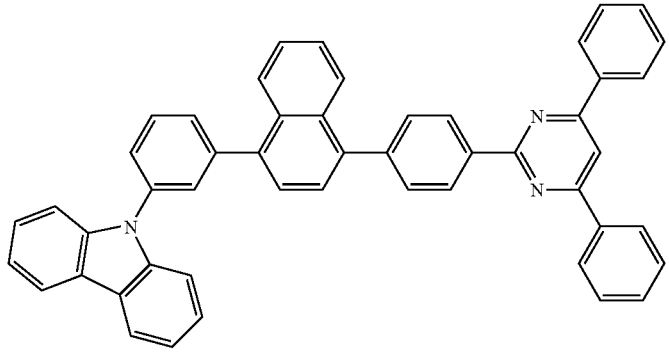
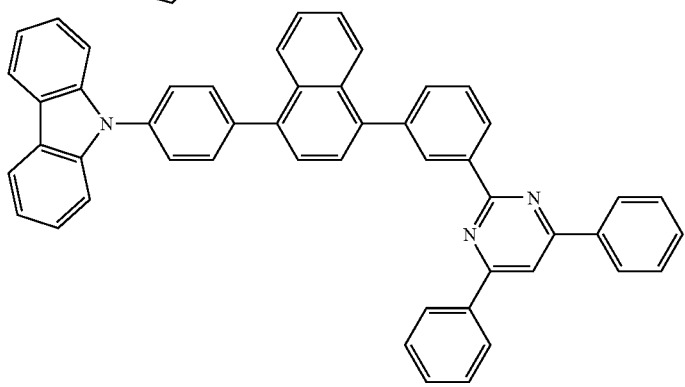
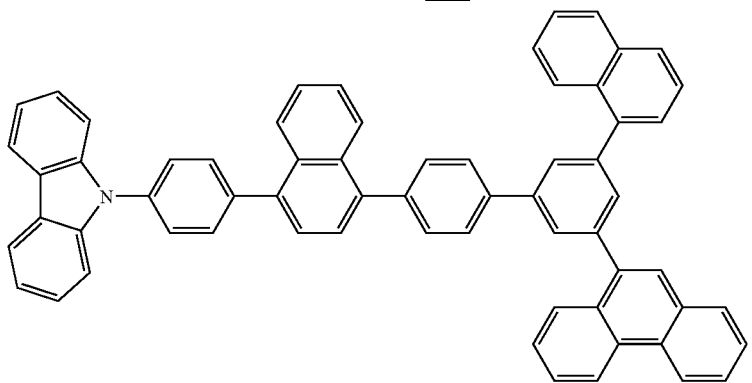
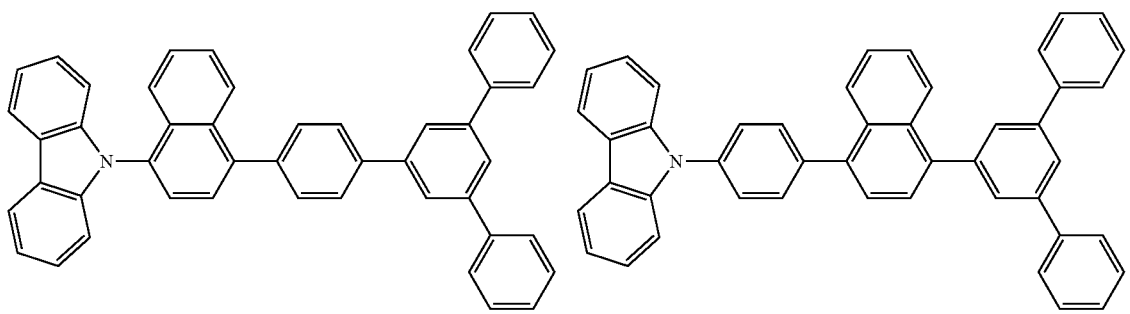
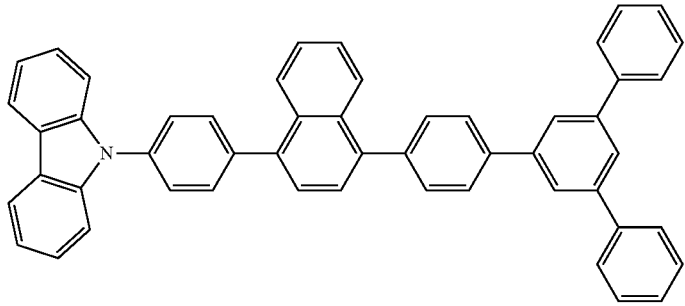

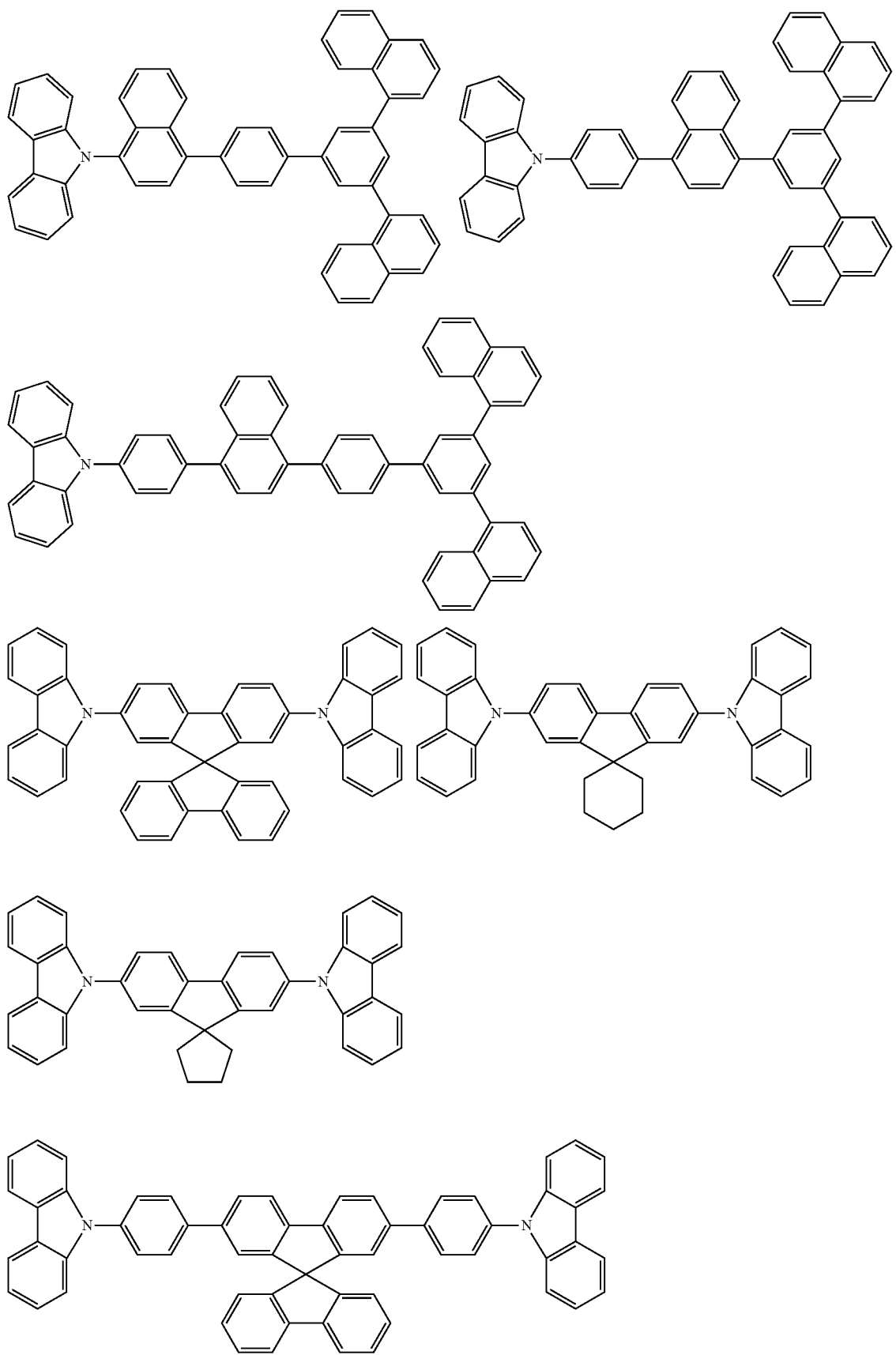

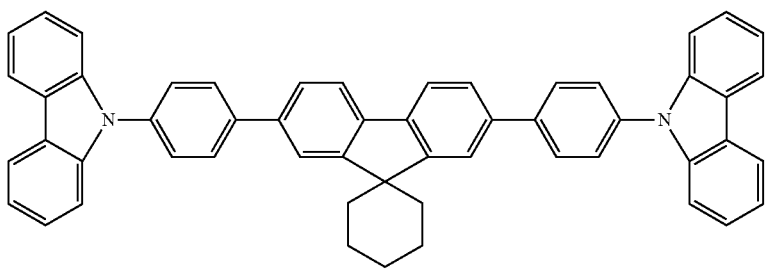
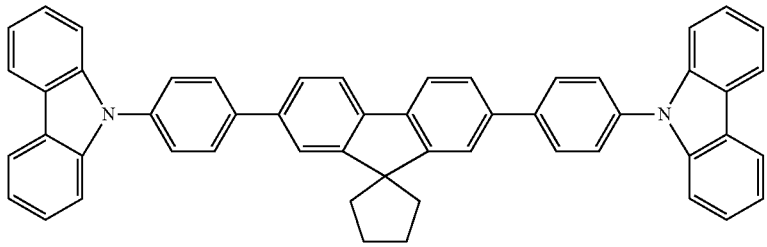
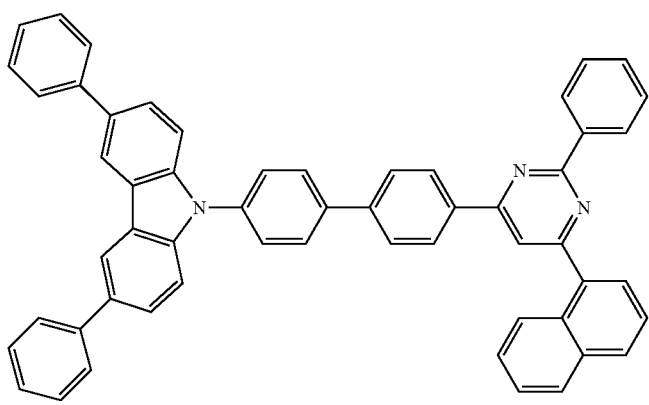
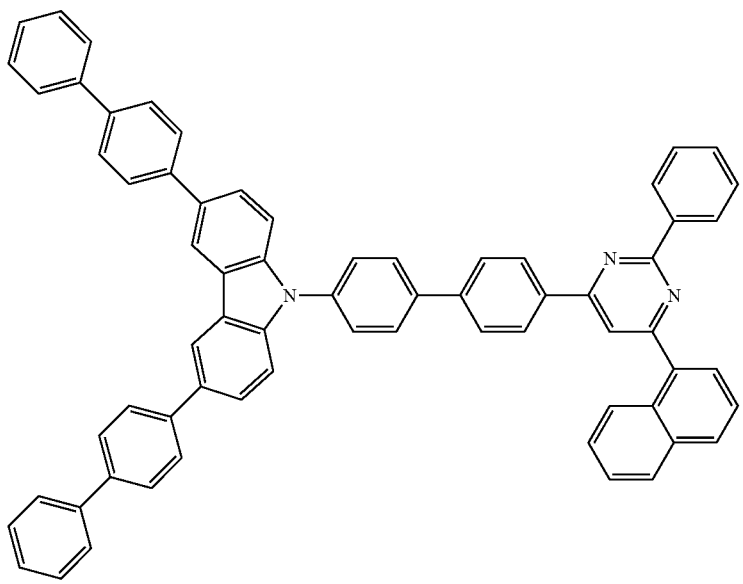

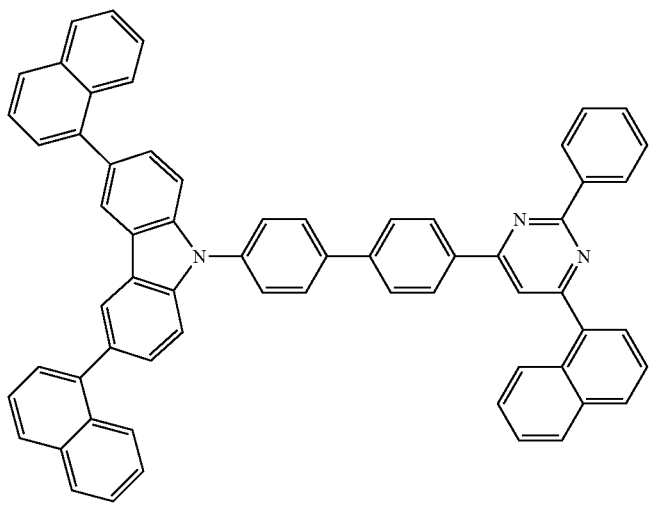
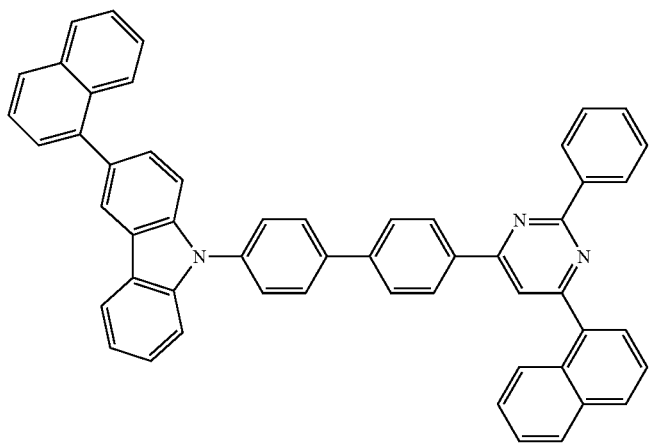
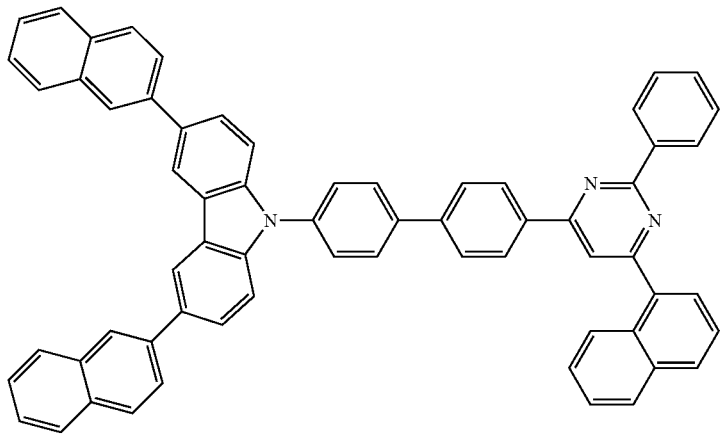

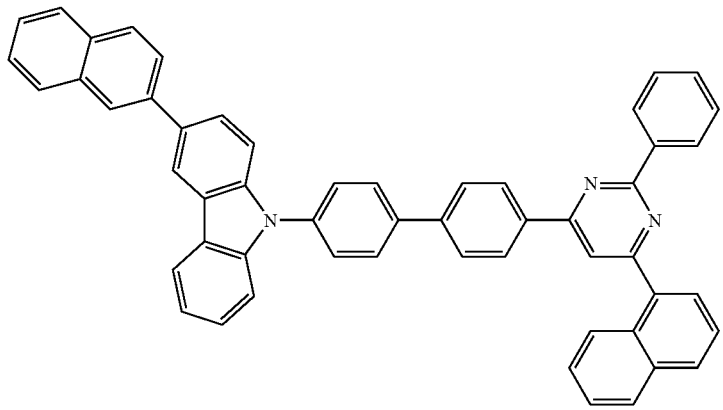
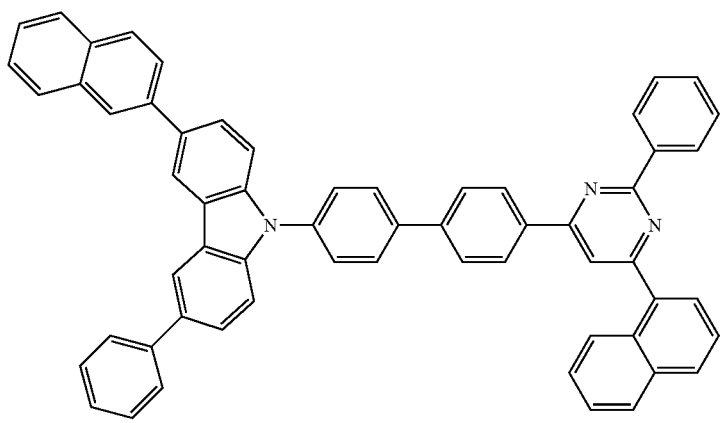
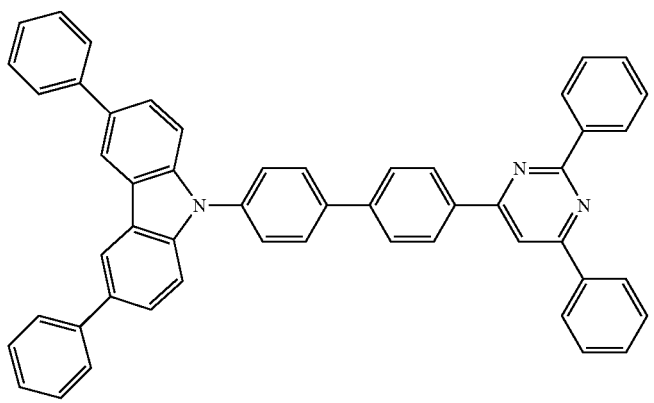

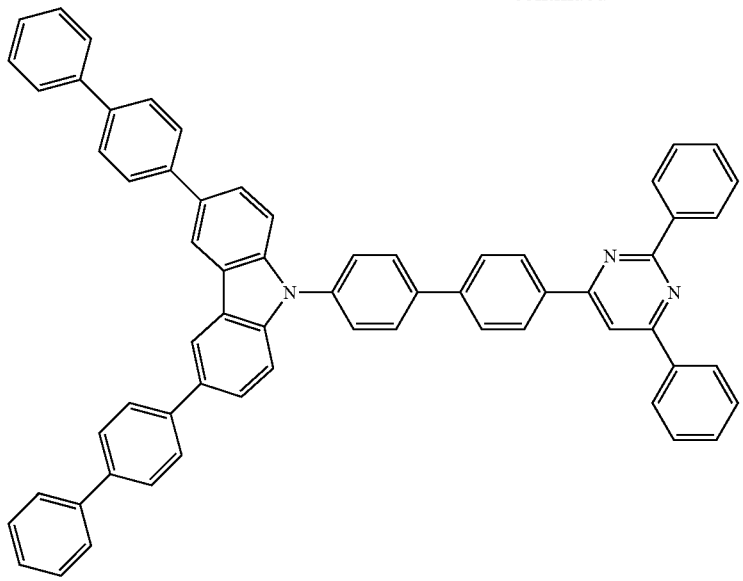
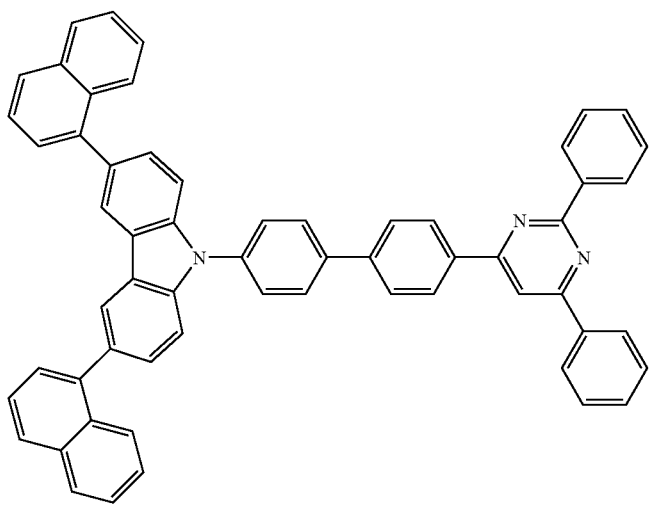
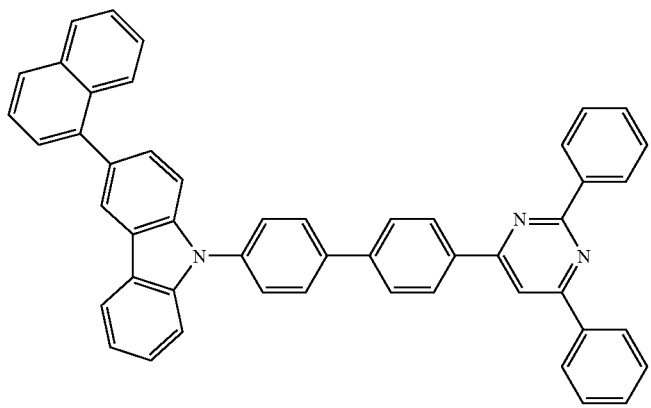

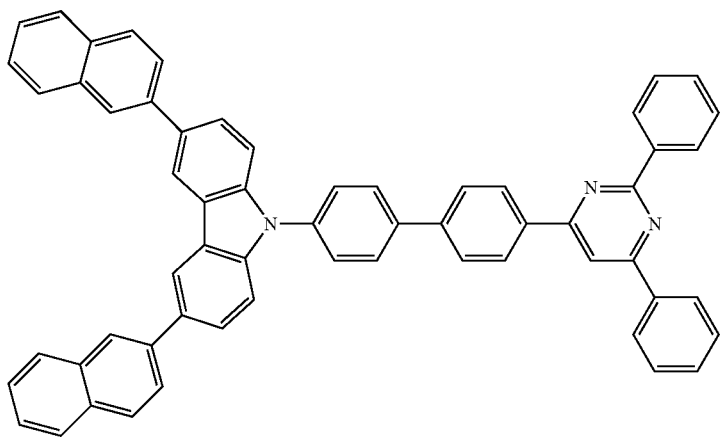
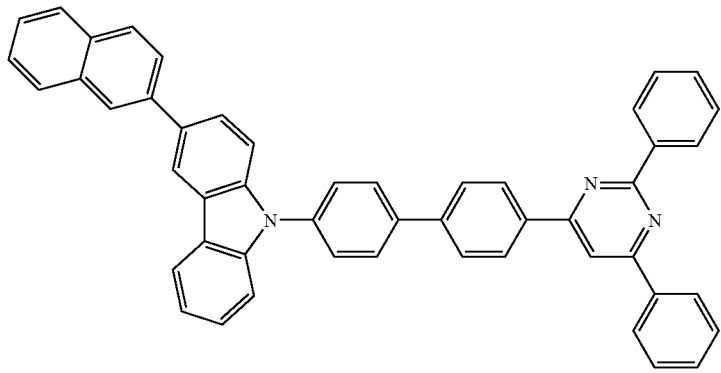
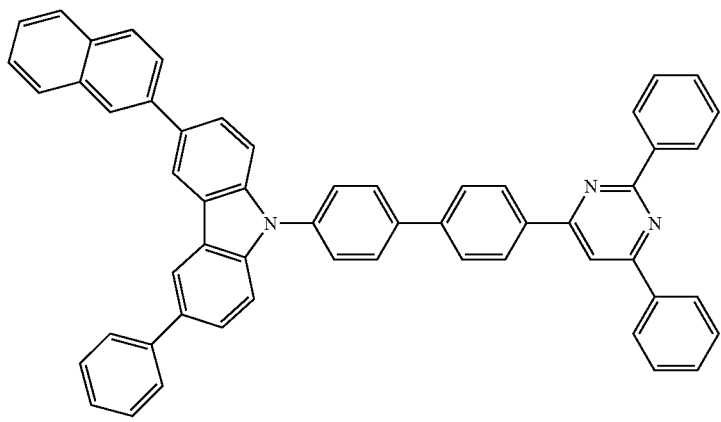
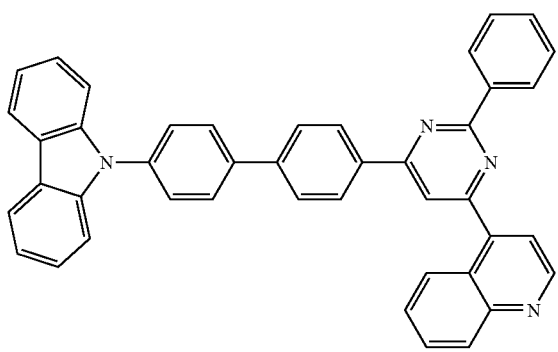

-continued
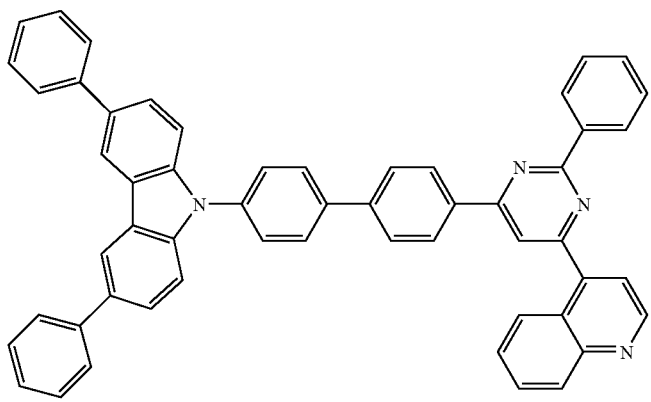
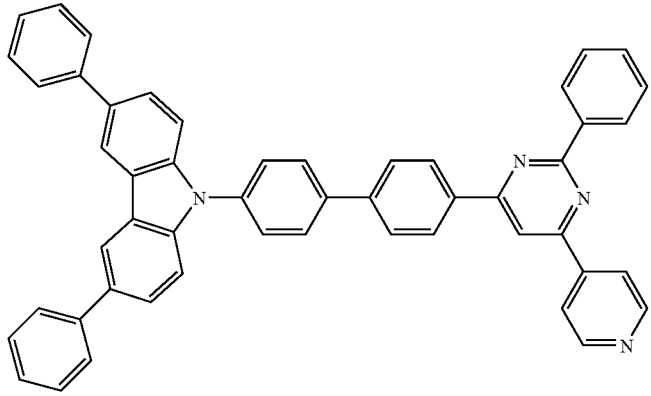
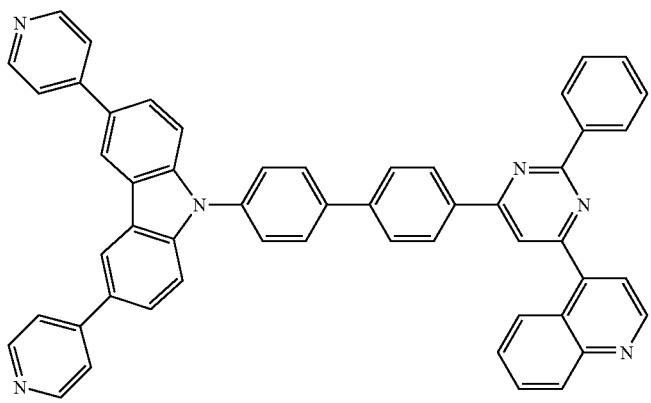
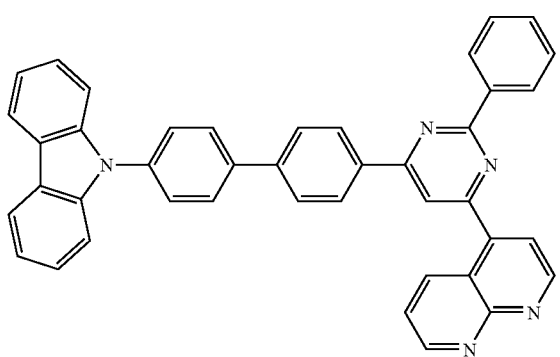

-continued

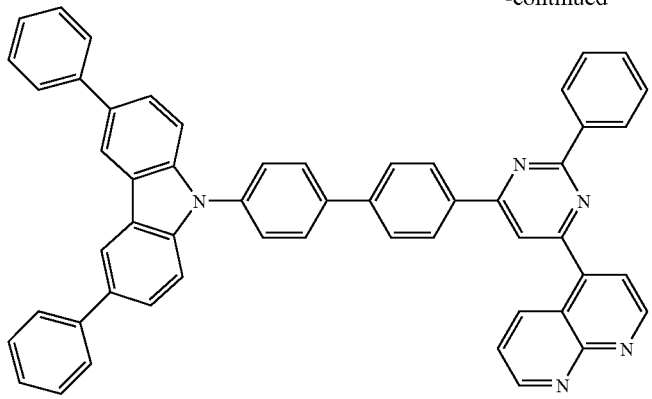

Next, the luminescent metal complex capable of emitting light having the red-based color to be used in the organic EL device of the present invention will be described.

As described above, the luminescent metal complex capable of emitting light having the red-based color is preferably a phosphorescent dopant, and is preferably a metal complex containing at least one metal selected from the group consisting of Ir, Ru, Pd, Pt, Os, and Re. The reason for this is that energy can be effectively transferred from a triplet exciton of the compound containing a condensed ring to be used in the organic EL device of the present invention when the luminescent metal complex is a complex of any one of those metals.

The luminescent metal complex to be used in the present invention is preferably a metal complex having a structure represented by any one of the following formulae:

MYp, MYpY'q, (MM')Yp, (MM')YpY'q, Yp(MM')Yq where:
M and M' each represent at least one metal selected from the group consisting of Ir, Ru, Pd, Pt, Os, and Re, and each may hold two or more metals identical to or different from each other in any one of its molecules to form a dinucleus;
Y and Y' each represent a ligand, and ligands identical to or different from each other may coordinate in accordance with the valence of a metal; and
p and q each represent an integer up to the valence of the metal.

The luminescent metal complex to be used in the present invention is not particularly limited as long as it is a luminescent metal complex capable of emitting light having a red-based color, and a ligand of the metal complex preferably has at least one skeleton selected from the group consisting of a phenylpyridine skeleton, a phenylquinoline skeleton, a phenylisoquinoline skeleton, a bipyridyl skeleton, a phenanthroline skeleton, and a benzothiophene pyridine skeleton. The reason for this is that the presence of any one of those skeletons in a molecule enables energy to be effectively transferred from a triplet exciton of a compound holding a condensed ring in any one of its molecules.

Examples of the light emitting metal complex include tris(2-phenylisoquinoline)iridium (Ir(piq)$_3$), tris(2-phenylpyridine)iridium, bis(2-phenylpyridine)iridium acetylacetonato (Ir(pq)$_2$(acac)), bis(2-phenylisoquinoline)iridium acetylacetonato, bis(2-benzothiophenepyridine)iridium acetylacetonato (Ir(btpy)$_2$(acac)), tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, and octaphenylpalladium porphyrin. Of those, Ir(piq)$_3$, Ir(pq)$_2$(acac), and Ir(btpy)$_2$(acac) are preferable.

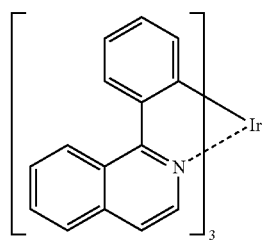

Ir (piq)$_3$

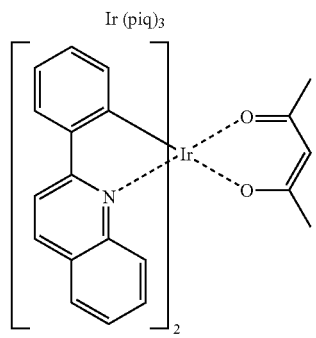

Ir (pq)$_2$ (acac)

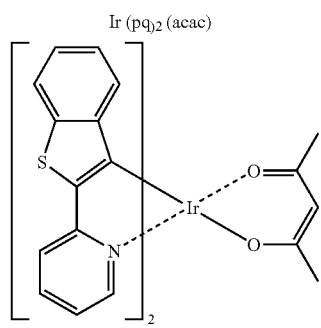

Ir (btpy)$_2$ (acac)

In the present invention, the loading of the luminescent metal complex in the light emitting layer is preferably 0.1 to 50 parts by weight, more preferably 0.5 to 40 parts by weight, or still more preferably 1 to 30 parts by weight with respect to 100 parts by weight of the compound containing a condensed ring (host material). The reason for this is as follows: when the loading of the luminescent metal complex is 0.1 part by weight or more, an effect of the addition of the complex can be exerted, so energy can be effectively transferred from a triplet exciton of the compound containing a condensed ring while when the loading is 50 parts by weight or less, the luminescent metal complex can be uniformly blended with ease, so emission luminance does not vary.

Typical examples of the device constitution of the organic EL device of the present invention include, but not limited to:

(1) anode/light emitting layer/cathode
(2) anode/hole injecting layer/light emitting layer/cathode
(3) anode/light emitting layer/electron injecting layer/cathode
(4) anode/hole injecting layer/light emitting layer/electron injecting layer/cathode
(5) anode/organic semiconductor layer/light emitting layer/cathode
(6) anode/organic semiconductor layer/electron barrier layer/light emitting layer/cathode
(7) anode/organic semiconductor layer/light emitting layer/adhesiveness improving layer/cathode
(8) anode/hole injecting layer/hole transporting layer/light emitting layer/electron injecting layer/cathode
(9) anode/insulating layer/light emitting layer/insulating layer/cathode
(10) anode/inorganic semiconductor layer/insulating layer/light emitting layer/insulating layer/cathode
(11) anode/organic semiconductor layer/insulating layer/light emitting layer/insulating layer/cathode
(12) anode/insulating layer/hole injecting layer/hole transporting layer/light emitting layer/insulating layer/cathode
(13) anode/insulating layer/hole injecting layer/hole transporting layer/light emitting layer/electron injecting layer/cathode The compound containing a condensed ring and the luminescent metal complex which are incorporated into the light emitting layer of the organic EL device in the present invention are as described above.

In addition, any other known light emitting material (such as PVK, PPV, CBP, Alq, BAlq, or a known complex) may be incorporated into the light emitting layer as desired to the extent that an object of the present invention is not impaired.

A known method such as a deposition method, a spin coating method, or an LB method is an applicable method of forming the light emitting layer in the present invention.

The organic EL device of the present invention may be provided with a hole injecting layer having a thickness of 5 nm to 5 μm. Providing such hole injecting layer improves the injection of a hole into the light emitting layer, so high emission luminance can be obtained, or the device can be driven at a low voltage. In addition, a compound having a hole mobility measured when a voltage in the range of $1\times10^4$ to $1\times10^6$ V/cm is applied of $1\times10^{-6}$ cm$^2$/V·sec or more and an ionization energy of 5.5 eV or less is preferably used in the hole injecting layer. Examples of such material for the hole injecting layer include a porphyrin compound, an aromatic tertiary amine compound, a styrylamine compound, an aromatic dimethylidine-based compound, and a condensed aromatic ring compound. More specific examples of the material include organic compounds such as 4,4'-bis[N-(1-naphthyl)-N-phenylamino]biphenyl (hereinafter abbreviated as "NPD") and 4,4',4"-tris[N-(3-methylphenyl)-N-phenylamino]triphenylamine (hereinafter abbreviated as "MTDATA"). It is also more preferable to laminate two or more hole injecting layers as required. In this case, if the anode, a hole injecting layer 1 (hole injecting material 1), a hole injecting layer 2 (hole injecting material 2), . . . , and the light emitting layer are laminated in the stated order, the ionization energies (Ip) of the hole injecting materials preferably satisfy the relationship of Ip (hole injecting material 1)<Ip (hole injecting material 2) . . . for reducing the driving voltage of the device.

In addition, it is also preferable to use an inorganic compound such as p-type Si or p-type SiC as a constituting component for the hole injecting layer. Furthermore, it is also preferable to provide an organic semiconductor layer having a conductivity of $1\times10^{-10}$ s/cm or more for a gap between the hole injecting layer and the anode layer or between the hole injecting layer and the light emitting layer. Providing such organic semiconductor layer additionally improves the injection of a hole into the light emitting layer.

The organic EL device of the present invention may be provided with an electron injecting layer having a thickness of 5 nm to 5 μm. Providing such electron injecting layer improves the injection of an electron into the light emitting layer, so high emission luminance can be obtained, or the device can be driven at a low voltage. In addition, a compound having an electron mobility measured when a voltage in the range of $1\times10^4$ to $1\times10^6$ V/cm is applied of $1\times10^{-6}$ cm$^2$/V·sec or more and an ionization energy in excess of 5.5 eV is preferably used in the electron injecting layer. Examples of such material for the electron injecting layer include: a metal complex (Al chelate: Alq) of 8-hydroxyquinoline or a derivative of the complex; and an oxadiazole derivative.

In addition, incorporating an alkali metal into the electron injecting layer can not only significantly reduce the voltage at which the device is driven but also lengthen the lifetime of the device.

The organic EL device of the present invention may be provided with a hole blocking layer having a thickness of 5 nm to 5 μm between the light emitting layer and the cathode. Providing such hole blocking layer improves the property with which a hole is confined in the organic light emitting layer, so high emission luminance can be obtained, or the device can be driven at a low voltage. Examples of such material for the hole blocking layer include 2,9-dimethyl-4,7-diphenyl-1,10-phenanthroline and 2,9-diethyl-4,7-diphenyl-1,10-phenanthroline. The hole blocking layer preferably further contains an alkali metal such as Li or Cs. As described above, a combination of a material for the hole blocking layer with an alkali metal can not only significantly reduce the voltage at which the organic EL device is driven but also lengthen the lifetime of the device. When an alkali metal is incorporated, the content of the alkali metal is preferably 0.01 to 30 wt %, more preferably 0.05 to 20 wt %, or still more preferably 0.1 to 15 wt % when the total amount of the hole blocking layer is defined as 100 wt %. The reason for this is as follows: when the content of the alkali metal is 0.01 wt % or more, an effect of the addition of the alkali metal is exerted while when the content is 30 wt % or less, the dispersibility of the alkali metal is so uniform that emission luminance does not vary.

In the present invention, a known method such as a deposition method, a spin coating method, or an LB method is an applicable method of forming the hole injecting layer, the electron injecting layer, or the hole blocking layer.

A reductive dopant is preferably added to an interfacial region between a cathode and an organic thin layer in the organic EL device of the present invention.

Examples of the reductive dopant include at least one kind selected from an alkali metal, an alkali metal complex, an alkali metal compound, an alkaline earth metal, an alkaline earth metal complex, an alkaline earth metal compound, a rare earth metal, a rare earth metal complex, a rare earth metal compound, and a halogen compound and an oxide thereof.

Examples of the alkali metal include Li having a work function of 2.93 eV, Na having a work function of 2.36 eV, K having a work function of 2.28 eV, Rb having a work function of 2.16 eV, and Cs having a work function of 1.95 eV, and an alkali metal having a work function of 3.0 eV or less is particularly preferable. Of those, Li, K, Rb, and Cs are preferable.

Examples of the alkali earth metal include Ca having a work function of 2.9 eV, Sr having a work function of 2.0 to 2.5 eV, and Ba having a work function of 2.52 eV, and an alkali earth metal having a work function of 3.0 or less is particularly preferable.

Examples of the rare earth metal include Sc, Y, Ce, Tb, and Yb, and a rare earth metal having a work function of 3.0 eV or less is particularly preferable.

Of those metals, a preferable metal has a particularly high reductive ability, so improvement of light emission intensity and long life can be attained by adding a small amount of the metal to an electron injecting region.

Examples of the alkali metal compound include an alkali oxide such as $Li_2O$, $Cs_2O$, or $K_2O$, and an alkali halide such as LiF, NaF, CsF, or KF. Of those, an alkali oxide or an alkali fluoride such as LiF, $Li_2O$, or NaF is preferable.

Examples of the alkali earth metal compound include Bao, SrO, Cao, and mixtures thereof such as $Ba_xSr_{1-x}O$ (0<x<1) and $Ba_xCa_{1-x}O$ (0<x<1). Of those, BaO, Sro, and CaO are preferable.

Examples of the rare earth metal compound include $YbF_3$, $ScF_3$, $ScO_3$, $Y_2O_3$, $Ce_2O_3$, $GdF_3$, and $TbF_3$. Of those, $YbF_3$, $ScF_3$, and $TbF_3$ are preferable.

The alkali metal complex, alkali earth metal complex, and rare metal complex are not particularly limited as long as they each include as a metal ion at least one of alkali metal ions, alkali earth metal ions, and rare earth metal ions. Meanwhile, preferable examples of a ligand include, but not limited to, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzoimidazole, hydroxybenzotriazole, hydroxyfluborane, bipyridyl, phenanthroline, phthalocyanine, porphyrin, cyclopentadiene, β-diketones, azomethines, and derivatives thereof.

For the addition form of the reductive dopant, it is preferable that the reductive dopant is formed in a shape of a layer or an island in the interfacial region. A preferable example of the forming method includes a method in which an organic substance which is a light emitting material or an electron injecting material for forming the interfacial region is deposited at the same time as the reductive dopant is deposited by a resistant heating deposition method, thereby dispersing the reductive dopant in the organic substance. The disperse concentration by molar ratio of the organic compound to the reductive dopant is 100:1 to 1:100, and is preferably 5:1 to 1:5.

In the case where the reductive dopant is formed into the shape of a layer, the light emitting material or electron injecting material which serves as an organic layer in the interface is formed into the shape of a layer. After that, the reductive dopant is solely deposited by the resistant heating deposition method to form a layer preferably having a thickness of 0.1 to 15 nm.

In the case where the reductive dopant is formed into the shape of an island, the light emitting material or electron injecting material which serves as an organic layer in the interface is formed into the shape of an island. After that, the reductive dopant is solely deposited by the resistant heating deposition method to form an island preferably having a thickness of 0.05 to 1 nm.

The anode in the organic EL device of the present invention corresponds to a lower electrode or to a counter electrode depending on the constitution of an organic EL display device. A metal, alloy, or electroconductive compound having a large work function (for example, 4.0 eV or more), or a mixture of them is preferably used in the anode. To be specific, each of electrode materials such as an indium tin oxide (ITO), an indium zinc oxide (IZO), copper iodide (CuI), tin oxide ($SnO_2$), zinc oxide (ZnO), gold, platinum, and palladium is preferably used alone, or two or more kinds of these electrode materials are preferably used in combination. The use of any one of those electrode materials enables an anode having a uniform thickness to be formed by employing a method with which a film can be formed in a dry state such as a vacuum deposition method, a sputtering method, an ion plating method, an electron beam deposition method, a chemical vapor deposition (CVD) method, a metal oxide chemical vapor deposition (MOCVD) method, or a plasma CVD method. When electroluminescence is extracted from the anode, the anode must be a transparent electrode. In that case, a conductive transparent material such as ITO, IZO, CuI, $SnO_2$, or ZnO is preferably used so that a value for a transmittance for electroluminescence is 70% or more. In addition, the thickness of the anode is not particularly limited; provided that a value for the thickness is in the range of preferably 10 to 1,000 nm, or more preferably 10 to 200 nm. The reason for this is as follows: when the thickness of the anode has a value in such range, a uniform thickness distribution and a transmittance for electroluminescence of 70% or more can be obtained while a value for the sheet resistance of the anode can be 1,000Ω/□ or less, or more preferably 100Ω/□ or less. It is also preferable to cause an arbitrary pixel in a light emitting surface to emit light by: sequentially providing the anode (lower electrode), an organic light emitting medium, and the cathode (counter electrode); and constituting the lower electrode and the counter electrode in an XY matrix fashion. That is, constituting the anode or the like as described above enables various pieces of information to be easily displayed in the organic EL device.

The cathode in the organic EL device of the present invention also corresponds to a lower electrode or to a counter electrode depending on the constitution of the organic EL device. A metal, alloy, or electroconductive compound having a small work function (for example, less than 4.0 eV), or a mixture of them or a product containing them is preferably used. To be specific, each of electrode materials each composed of, for example, any one of: a metal selected from sodium, a sodium-potassium alloy, cesium, magnesium, lithium, a magnesium-silver alloy, aluminum, aluminum oxide, an aluminum-lithium alloy, indium, and a rare earth metal; a mixture of any one of these metals and a material for the organic thin film layer; and a mixture of any one of these metals and a material for the electron injecting layer is preferably used alone, or two or more kinds of these electrode materials are preferably used in combination. In addition, as in the case of the anode, the thickness of the cathode is not particularly limited; provided that a value for the thickness is specifically in the range of preferably 10 to 1,000 nm, or more preferably 10 to 200 nm. Furthermore, when electroluminescence is extracted from the cathode, the cathode must be a transparent electrode. In that case, a value for a transmittance for electroluminescence is preferably 70% or more. As in the case of the anode, the cathode is preferably formed by employing a method with which a film can be formed in a dry state such as a vacuum deposition method or a sputtering method.

A support substrate in the organic EL device of the present invention is preferably excellent in mechanical strength and preferably has small permeability of moisture or of oxygen. Specific examples of the support substrate include a glass sheet, a metal sheet, a ceramic sheet, and a plastic sheet (made of, for example, a polycarbonate resin, an acrylic resin, a vinyl chloride resin, a polyethylene terephthalate resin, a polyimide resin, a polyester resin, an epoxy resin, a phenol resin, a silicon resin, or a fluorine resin). In addition, a support substrate composed of any one of those materials preferably further has an inorganic film formed on the support substrate, or is preferably subjected to a moisture-resistant treatment or hydrophobic treatment as a result of the application of a fluorine resin in order that moisture may be prevented from entering the organic EL device. In addition, a moisture content and a gas permeability coefficient in the support substrate are preferably small in order that moisture may be prevented from entering, in particular, the organic thin film layer. To be specific, the moisture content and gas permeability coefficient of the support substrate are preferably 0.0001 wt % or less and $1\times10^{-13}$ cc·cm/cm$^2$·sec·cmHg or less, respectively.

EXAMPLES

Next, the present invention will be described in more detail by way of examples.

It should be noted that the performance of each organic EL device obtained in each example was evaluated for performance as described below.
(1) Initial performance: A predetermined voltage was applied, and a current density at the time of the application was measured. At the same time, an emission luminance value and chromaticity coordinates in CIE 1931 chromaticity coordinates were measured and evaluated by using a luminance meter.
(2) Lifetime: The organic EL device was driven at a constant current and an initial luminance of 1,000 cd/m$^2$, and was evaluated for lifetime in terms of the half life of the luminance and a change in chromaticity.

Example 1

(1) Synthesis of Compound (H-1)

Compound (H-1) was synthesized as described below.

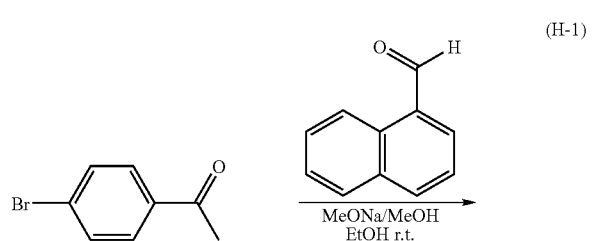

(H-1)

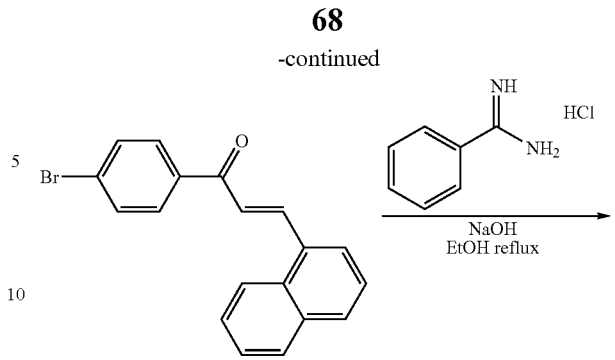

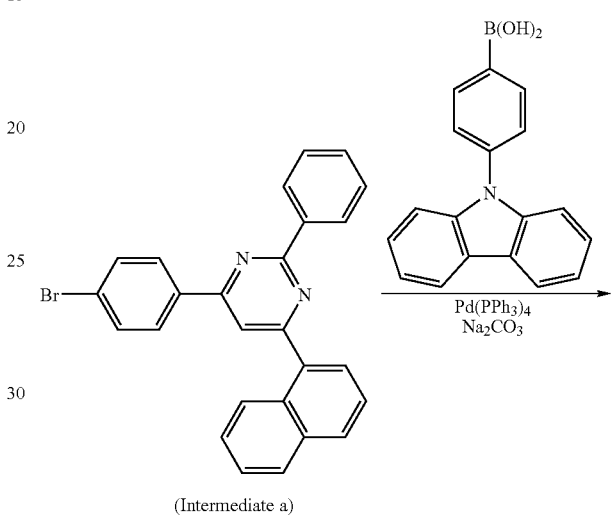

(Intermediate a)

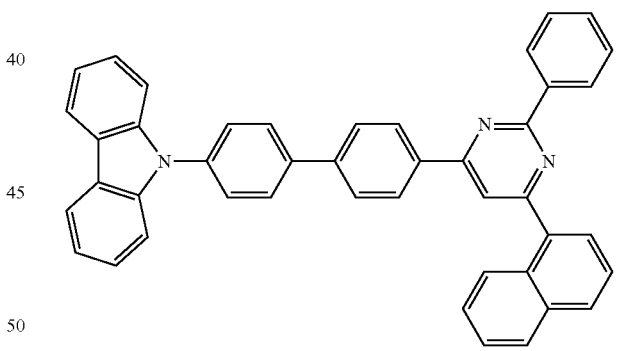

19.9 g (100 mmol) of 4-bromoacetophenone and 15.6 g (100 mmol) of 1-naphthoaldehyde were loaded into a 300-ml three-necked flask, followed by argon replacement. Next, 200 ml of ethanol and 10 ml of a 1N solution of sodium methoxide in methanol were added, and the whole was stirred at room temperature for 5 hours. After that, the temperature of the resultant was increased in an oil bath at 70° C., and the resultant was reacted for an additional 4 hours while ethanol was refluxed. Next, 9.40 g (60 mmol) of benzamidine hydrochloride and 8.00 g (200 mmol) of sodium hydroxide were added, the temperature of the whole was increased in an oil bath at 70° C., and the whole was reacted for 5 hours. After the completion of the reaction, the precipitate was separated by filtration and purified by means of silica gel column chromatography (developing solvent: methylene chloride), whereby 15.7 g of (Intermediate a) were obtained (35.9% yield).

3.06 g (7 mmol) of (Intermediate a), 2.41 g (8.4 mmol) of 4-(N-carbazolyl)phenylboric acid, and 0.291 g (0.25 mmol, 3% Pd) of tetrakis(triphenylphosphine)palladium(0) were loaded into a 100-ml three-necked flask, and the inside of the container was replaced with argon. Furthermore, 26 ml of 1,2-dimethoxyethane and 12.5 ml (3 eq) of a 2M aqueous solution of sodium carbonate were added, and the whole was refluxed under heat in an oil bath at 90° C. for 9 hours. After one night, ion-exchanged water and methylene chloride were added to extract an organic layer, and the layer was washed with ion-exchanged water and a saturated salt solution. Next, the resultant was dried with anhydrous magnesium sulfate, and the solvent was removed by distillation. 3.57 g of a gray solid as a residue were purified by means of silica gel column chromatography (developing solvent: hexane/methylene chloride), and the solvent was removed by distillation, whereby 2.94 g of Compound (H-1) were obtained. The result of the measurement of the field desorption mass spectrum (FD-MS) of Compound (H-1) obtained is shown below.

FD-MS: calcd for $C_{43}H_{29}N_3$=600, found m/z=600 (M$^+$, 100).

(2) Production of Organic EL Device

A glass substrate equipped with an ITO transparent electrode measuring 25 mm wide by 75 mm long by 0.7 mm thick was subjected to ultrasonic cleaning in isopropyl alcohol for 5 minutes. After that, the substrate was subjected to UV ozone cleaning for 30 minutes. The glass substrate equipped with the transparent electrode after the cleaning was mounted on a substrate holder of a vacuum deposition device. First, a copper phthalocyanine film (hereinafter abbreviated as the "CuPc film") having a thickness of 10 nm was formed on the surface where the transparent electrode was formed in such a manner that the film would cover the transparent electrode. The CuPc film functions as a hole injecting layer. A 4,4'-bis[N-(1-naphthyl)-N-phenylamino] biphenyl film (hereinafter abbreviated as the "α-NPD film") having a thickness of 30 nm was formed on the CuPc film. The α-NPD film functions as a hole transporting layer. Furthermore, Compound (H-1) described above as a host material and, at the same time, tris(2-phenylisoquinoline) iridium (hereinafter abbreviated as "Ir(piq)3") capable of emitting red light described above as a phosphorescent Ir metal complex dopant were added with each other, and were deposited from the vapor, whereby a light emitting layer having a thickness of 30 nm was formed on the α-NPD film. The concentration of Ir(piq)$_3$ in the light emitting layer was set to 15 wt %. (1,1'-bisphenyl)-4-olato)bis(2-methyl-8-quinolinolato)aluminum was formed into a film having a thickness of 10 nm (hereinafter abbreviated as the "BAlq film") on the light emitting layer. The BAlq film functions as a hole blocking layer. Furthermore, an aluminum complex of 8-hydroxyquinoline was formed into a film having a thickness of 40 nm (hereinafter abbreviated as the "Alq film") on the film. The Alq film functions as an electron injecting layer. After that, LiF as an alkali metal halide was deposited from the vapor to have a thickness of 0.2 nm, and then aluminum was deposited from the vapor to have a thickness of 150 nm. The Al/LiF functions as a cathode. Thus, an organic EL device was produced.

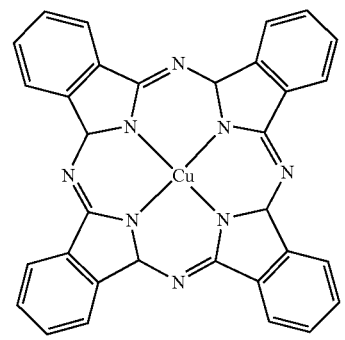

CuPc

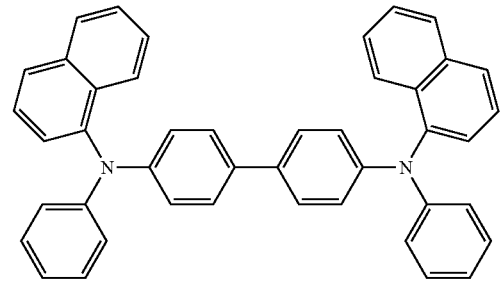

α-NPD

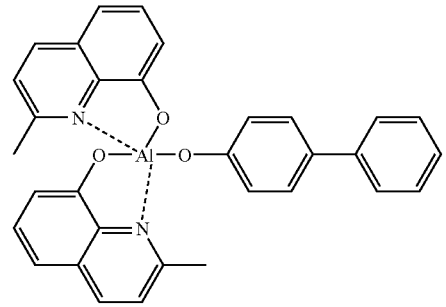

BAlq

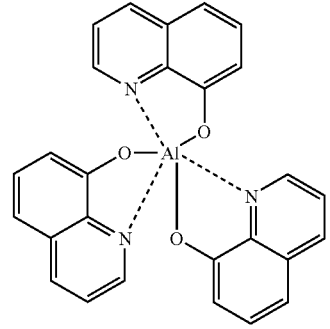

Alq

The resultant device was subjected to a current test. As a result, red light having an emission luminance of 101.0 cd/m$^2$ was emitted at a voltage of 5.7 V and a current density of 1.1 mA/cm$^2$. Chromaticity coordinates were (0.668, 0.327), and a current efficiency was 9.2 cd/A. In addition, the device was driven at a constant current and an initial luminance of 1,000 cd/m$^2$. The time required for the initial luminance to reduce in half to an emission luminance of 500 cd/m$^2$ was 25,400 hours.

Examples 2 and 3

Organic EL devices were each produced in the same manner as in Example 1 except that each of Compound (H-2) and Compound (H-3) described below was used instead of Compound (H-1) as a host material for a light emitting layer.

Each of the resultant organic EL devices was subjected to a current test and evaluated for lifetime in the same manner as in Example 1. Table 1 shows the results.

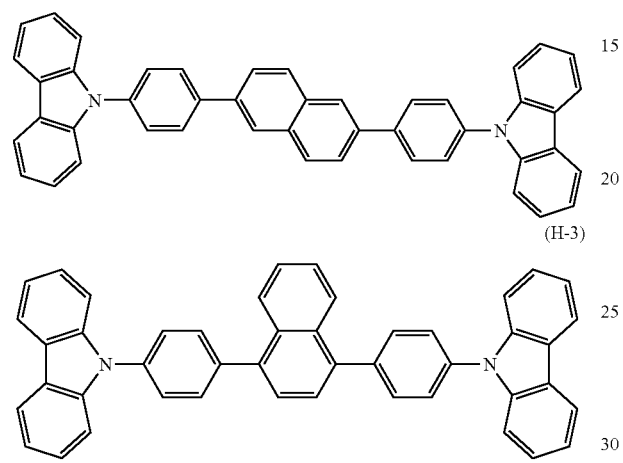

Example 4

Synthesis of Compound (H-4) and Production of Organic EL Device

Compound (H-4) was synthesized as described below.

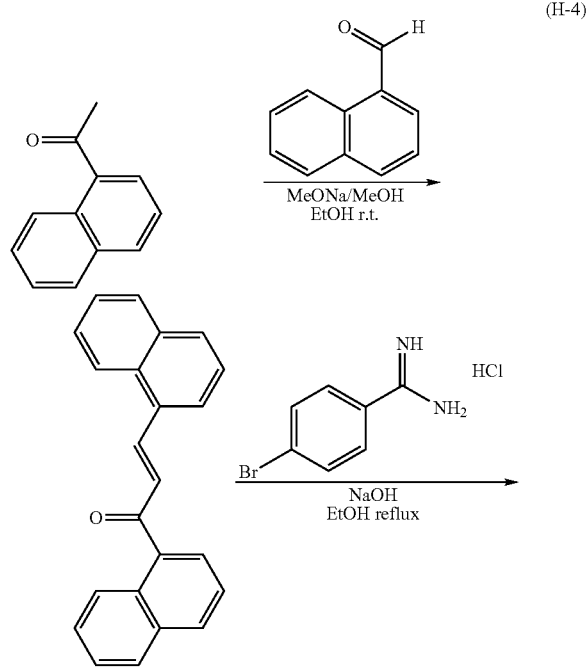

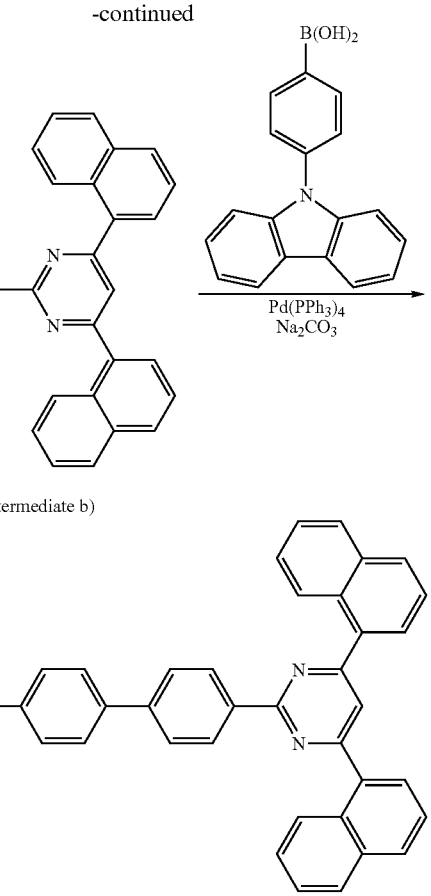

17.0 g (100 mmol) of 1'-acetonaphthone and 15.6 g (100 mmol) of 1-naphthoaldehyde were loaded into a 300-ml three-necked flask, followed by argon replacement. Next, 200 ml of ethanol and 10 ml of a 1N solution of sodium methoxide in methanol were added, and the whole was stirred at room temperature for 5 hours. After that, the temperature of the resultant was increased in an oil bath at 70° C., and the resultant was reacted for an additional 4 hours while ethanol was refluxed. Next, 14.1 g (60 mmol) of 4-bromobenzamidine hydrochloride and 8.00 g (200 mmol) of sodium hydroxide were added, the temperature of the whole was increased in an oil bath at 70° C., and the whole was reacted for 5 hours. After the completion of the reaction, the precipitate was separated by filtration and purified by means of silica gel column chromatography (developing solvent: methylene chloride), whereby 20.5 g of (Intermediate b) were obtained (42.0% yield).

3.41 g (7 mmol) of (Intermediate b), 2.41 g (8.4 mmol) of 4-(N-carbazolyl)phenylboric acid, and 0.291 g (0.25 mmol, 3% Pd) of tetrakis(triphenylphosphine)palladium(0) were loaded into a 100-ml three-necked flask, and the inside of the container was replaced with argon. Furthermore, 26 ml of 1,2-dimethoxyethane and 12.5 ml (3 eq) of a 2M aqueous solution of sodium carbonate were added, and the whole was refluxed under heat in an oil bath at 90° C. for 9 hours. After one night, ion-exchanged water and methylene chloride were added to extract an organic layer, and the layer was washed with ion-exchanged water and a saturated salt solution. Next, the resultant was dried with anhydrous magnesium sulfate, and the solvent was removed by distillation. 3.48 g of a gray solid as a residue were purified by means of silica gel column chromatography (developing solvent: hexane/methylene chloride), and the solvent was removed by distillation, whereby 2.83 g of Compound (H-4) were obtained. The result of the measurement of FD-MS of Compound (H-4) obtained is shown below.

FD-MS: calcd for $C_{48}H_{31}N_3$=650, found m/z=650 (M$^+$, 100).

An organic EL device was produced in the same manner as in Example 1 except that Compound (H-4) obtained was used instead of Compound (H-1) as a host material for a light emitting layer.

The resultant organic EL device was subjected to a current test and evaluated for lifetime in the same manner as in Example 1. Table 1 shows the results.

Example 5

Synthesis of Compound (H-5) and Production of Organic EL Device

Compound (H-5) was synthesized as described below.

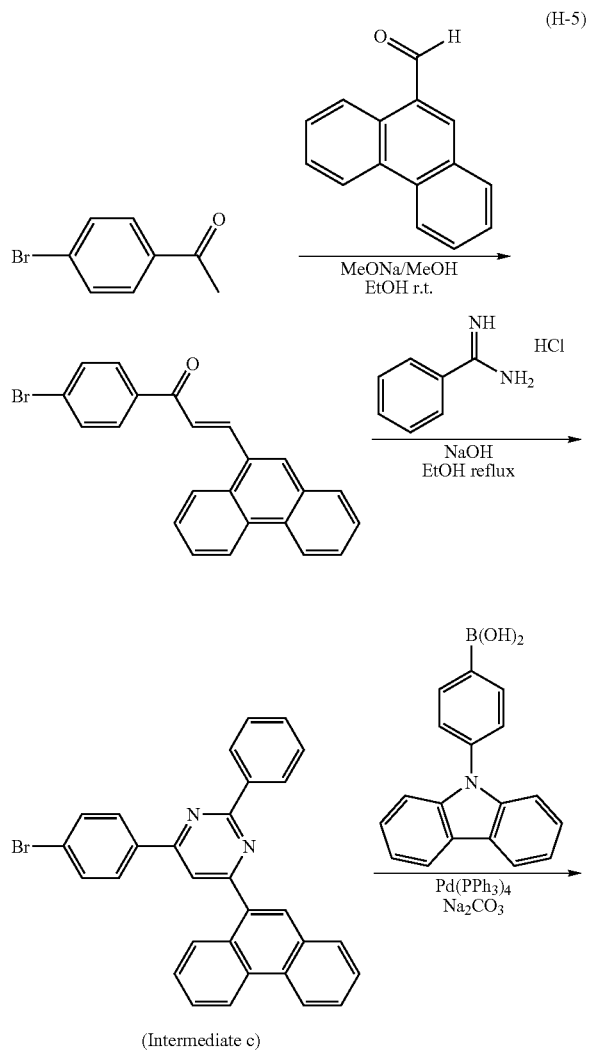

(Intermediate c)

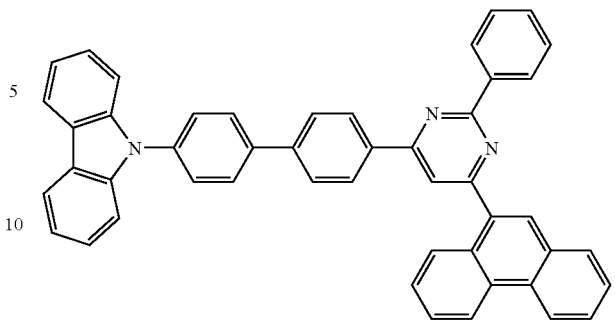

19.9 g (100 mmol) of 4-bromoacetophenone and 20.6 g (100 mmol) of 9-phenanthrynaldehyde were loaded into a 300-ml three-necked flask, followed by argon replacement. Next, 200 ml of ethanol and 10 ml of a 1N solution of sodium methoxide in methanol were added, and the whole was stirred at room temperature for 5 hours. After that, the temperature of the resultant was increased in an oil bath at 70° C., and the resultant was reacted for an additional 4 hours while ethanol was refluxed. Next, 9.40 g (60 mmol) of benzamidine hydrochloride and 8.00 g (200 mmol) of sodium hydroxide were added, the temperature of the whole was increased in an oil bath at 70° C., and the whole was reacted for 5 hours. After the completion of the reaction, the precipitate was separated by filtration and purified by means of silica gel column chromatography (developing solvent: methylene chloride), whereby 19.0 g of (Intermediate c) were obtained (39.0% yield).

3.41 g (7 mmol) of (Intermediate c), 2.41 g (8.4 mmol) of 4-(N-carbazolyl)phenylboric acid, and 0.291 g (0.25 mmol, 3% Pd) of tetrakis(triphenylphosphine)palladium(0) were loaded into a 100-ml three-necked flask, and the inside of the container was replaced with argon. Furthermore, 26 ml of 1,2-dimethoxyethane and 12.5 ml (3 eq) of a 2M aqueous solution of sodium carbonate were added, and the whole was refluxed under heat in an oil bath at 90° C. for 9 hours. After one night, ion-exchanged water and methylene chloride were added to extract an organic layer, and the layer was washed with ion-exchanged water and a saturated salt solution. Next, the resultant was dried with anhydrous magnesium sulfate, and the solvent was removed by distillation. 3.40 g of a gray solid as a residue were purified by means of silica gel column chromatography (developing solvent: hexane/methylene chloride), and the solvent was removed by distillation, whereby 2.77 g of Compound (H-5) were obtained. The result of the measurement of FD-MS of Compound (H-5) obtained is shown below.

FD-MS: calcd for $C_{48}H_{31}N_3$=650, found m/z=650 (M$^+$, 100).

An organic EL device was produced in the same manner as in Example 1 except that Compound (H-5) obtained was used instead of Compound (H-1) as a host material for a light emitting layer.

The resultant organic EL device was subjected to a current test and evaluated for lifetime in the same manner as in Example 1. Table 1 shows the results.

Example 6

Synthesis of Compound (H-6) and Production of Organic EL Device

Compound (H-6) was synthesized as described below.

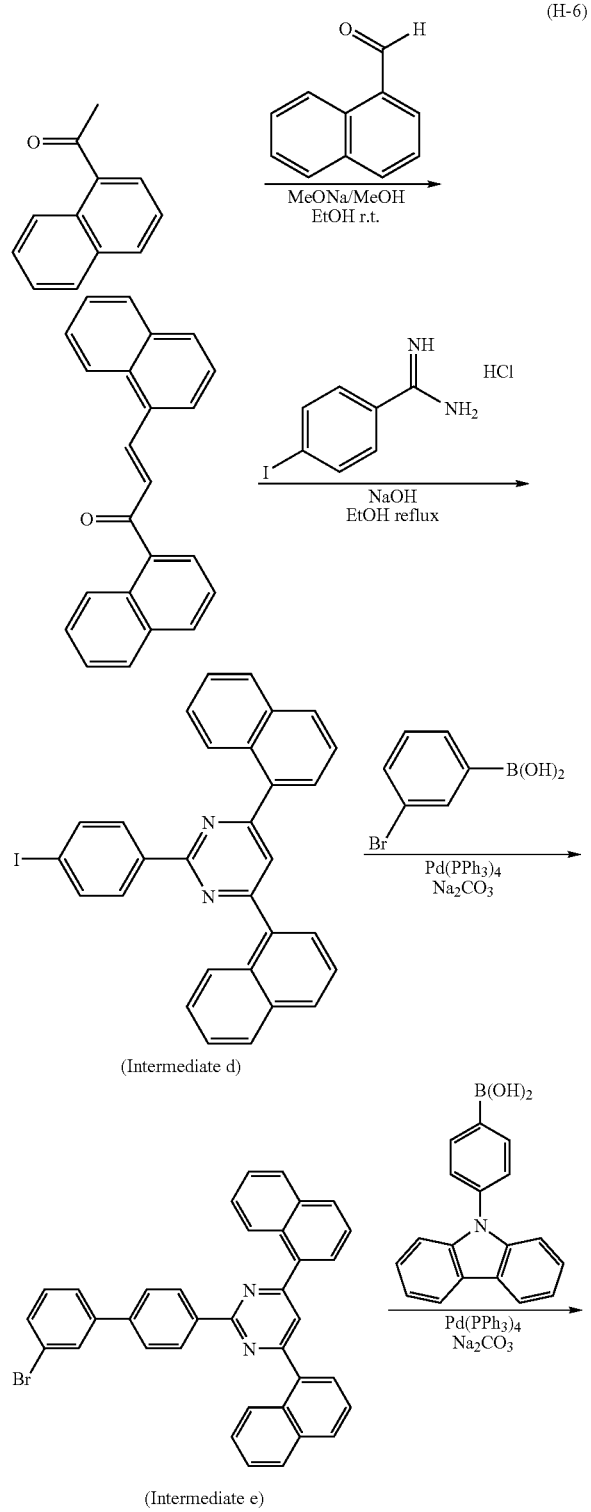

(Intermediate d)

(Intermediate e)

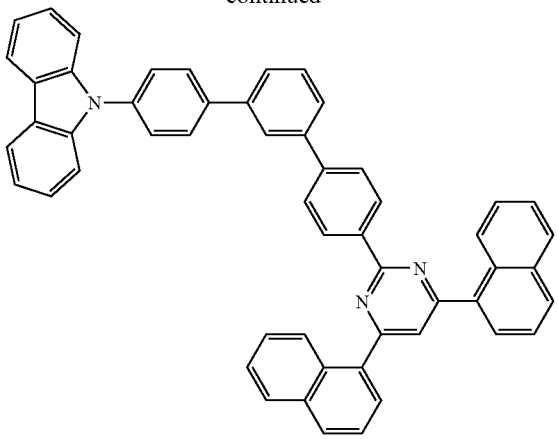

(H-6)

17.0 g (100 mmol) of 1'-acetonaphthone and 15.6 g (100 mmol) of 1-naphthoaldehyde were loaded into a 300-ml three-necked flask, followed by argon replacement. Next, 200 ml of ethanol and 10 ml of a 1N solution of sodium methoxide in methanol were added, and the whole was stirred at room temperature for 5 hours. After that, the temperature of the resultant was increased in an oil bath at 70° C., and the resultant was reacted for an additional 4 hours while ethanol was refluxed. Next, 17.0 g (60 mmol) of 4-iodobenzamidine hydrochloride and 8.00 g (200 mmol) of sodium hydroxide were added, the temperature of the whole was increased in an oil bath at 70° C., and the whole was reacted for 5 hours. After the completion of the reaction, the precipitate was separated by filtration and purified by means of silica gel column chromatography (developing solvent: methylene chloride), whereby 19.9 g of (Intermediate d) were obtained (37.3% yield).

5.61 g (10.5 mmol) of (Intermediate d), 2.01 g (10 mmol) of 3-bromophenylboric acid, and 0.347 g (0.3 mmol, 3% Pd) of tetrakis(triphenylphosphine)palladium(0) were loaded into a 100-ml three-necked flask, and the inside of the container was replaced with argon. Furthermore, 20 ml of 1,2-dimethoxyethane and 15.0 ml (3 eq) of a 2M aqueous solution of sodium carbonate were added, and the whole was refluxed under heat in an oil bath at 90° C. for 9 hours. After one night, ion-exchanged water and methylene chloride were added to extract an organic layer, and the layer was washed with ion-exchanged water and a saturated salt solution. Next, the resultant was dried with anhydrous magnesium sulfate, and the solvent was removed by distillation. 3.48 g of a gray solid as a residue were purified by means of silica gel column chromatography (developing solvent: hexane/methylene chloride), and the solvent was removed by distillation, whereby 4.36 g of (Intermediate e) were obtained (7.73 mmol, 77.3% yield).

3.94 g (7 mmol) of (Intermediate e), 2.41 g (8.4 mmol) of 4-(N-carbazolyl)phenylboric acid, and 0.291 g (0.25 mmol, 3% Pd) of tetrakis(triphenylphosphine)palladium(0) were loaded into a 100-ml three-necked flask, and the inside of the container was replaced with argon. Furthermore, 26 ml of 1,2-dimethoxyethane and 12.5 ml (3 eq) of a 2M aqueous solution of sodium carbonate were added, and the whole was refluxed under heat in an oil bath at 90° C. for 9 hours. After one night, ion-exchanged water and methylene chloride were added to extract an organic layer, and the layer was washed with ion-exchanged water and a saturated salt solution. Next, the resultant was dried with anhydrous magnesium sulfate, and the solvent was removed by distillation. 3.84 g of a gray solid as a residue were purified by means of silica gel column chromatography (developing solvent: hexane/methylene chloride), and the solvent was removed by distillation, whereby 2.88 g of Compound (H-6) were obtained. The result of the measurement of FD-MS of Compound (H-6) obtained is shown below.

FD-MS: calcd for $C_{54}H_{35}N_3$=726, found m/z=726 (M⁺, 100).

An organic EL device was produced in the same manner as in Example 1 except that Compound (H-6) obtained was used instead of Compound (H-1) as a host material for a light emitting layer.

The resultant organic EL device was subjected to a current test and evaluated for lifetime in the same manner as in Example 1. Table 1 shows the results.

Example 7

Production of Organic EL Device

An organic EL device was produced in the same manner as in Example 1 except that $Ir(pq)_2(acac)$ capable of emitting orange light described above was used instead of $Ir(piq)_3$ as a metal complex dopant.

The resultant organic EL device was subjected to a current test and evaluated for lifetime in the same manner as in Example 1. The results are shown below.

Comparative Example 1

Production of Organic EL Device

An organic EL device was produced in the same manner as in Example 1 except that: $Ir(ppy)_3$ capable of emitting green light described below was used instead of $Ir(piq)_3$ as a metal complex dopant in a light emitting layer; and the concentration of the metal complex dopant in the light emitting layer was changed to 5 wt %.

The resultant organic EL device was subjected to a current test and evaluated for lifetime in the same manner as in Example 1. Table 1 shows the results. As shown in Table 1, the organic EL device of Comparative Example 1 had such a short lifetime that the device was impractical.

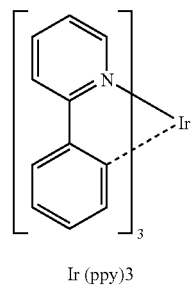

Ir (ppy)3

Comparative Example 2

Production of Organic EL Device

An organic EL device was produced in the same manner as in Example 1 except that CBP described below was used instead of Compound (H-1) as a host material in a light emitting layer.

The resultant organic EL device was subjected to a current test and evaluated for lifetime in the same manner as in Example 1. Table 1 shows the results. As shown in Table 1, the organic EL device of Comparative Example 2 had such a short lifetime that the device was impractical.

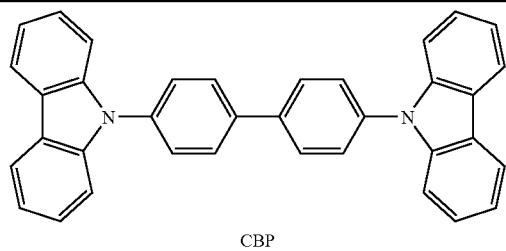

CBP

| | Host material for light emitting layer | Dopant for light emitting layer | Voltage (v) | Current density (mA/cm²) | Emission luminance (cd/m²) | Current efficiency (cd/A) | Chromaticity coordinates (x, y) | Half lifetime (hours) |
|---|---|---|---|---|---|---|---|---|
| Example 1 | H-1 | Ir(piq)3 | 5.7 | 1.1 | 101.0 | 9.2 | (0.668, 0.327) | 25400 |
| Example 2 | H-2 | Ir(piq)3 | 5.5 | 1.2 | 103.2 | 8.6 | (0.670, 0.325) | 23500 |
| Example 3 | H-3 | Ir(piq)3 | 5.6 | 1.2 | 103.4 | 8.6 | (0.666, 0.329) | 21200 |
| Example 4 | H-4 | Ir(piq)3 | 5.4 | 1.2 | 100.5 | 8.4 | (0.669, 0.323) | 21300 |
| Example 5 | H-5 | Ir(piq)3 | 5.8 | 1.2 | 101.2 | 8.4 | (0.663, 0.321) | 20800 |
| Example 6 | H-6 | Ir(piq)3 | 5.6 | 1.2 | 100.4 | 8.4 | (0.668, 0.328) | 22700 |
| Example 7 | H-1 | Ir(pq)2(acac) | 5.5 | 0.6 | 97.0 | 16.2 | (0.607, 0.386) | 23100 |
| Comparative Example 1 | H-1 | Ir(ppy)3 | 7.0 | 0.9 | 103.0 | 11.6 | (0.353, 0.600) | <100 |
| Comparative Example 2 | CBP | Ir(piq)3 | 5.9 | 1.4 | 103.3 | 7.4 | (0.662, 0.332) | 8300 |

As shown in Table 1, each of the organic EL devices of Examples 1 to 7 had a light emitting layer formed of a compound containing a condensed ring and of a luminescent metal complex capable of emitting light having a red-based color, so each of the organic EL devices had an extremely excellent effect: each of the organic EL devices had a lifetime 100 or more times as long as that of the organic EL device of Comparative Example 1 using a luminescent complex capable of emitting light having a green-based color. In addition, each of the organic EL devices of Examples 1 to 7 has a remarkable effect: each of the organic EL devices has a lifetime two to three times as long as that in the case of Comparative Example 2 where a light emitting layer is formed by combining a known compound CBP, which has been widely used as a phosphorescent material, as a host material and a luminescent metal complex capable of emitting light having a red-based color.

INDUSTRIAL APPLICABILITY

As described above in detail, the organic EL device of the present invention is practical because it has high luminous efficiency, high heat resistance, and an extremely long lifetime.

Therefore, the device is extremely practical and useful as a full-color display, an information display instrument, an on-vehicle display instrument, or a lighting apparatus.

The invention claimed is:
1. An organic electroluminescence device, comprising an organic thin film layer composed of one or more layers comprising a light emitting layer, the organic thin film layer being interposed between a cathode and an anode, wherein the light emitting layer includes a carbozole compound containing a ring as a host material and a luminescent metal complex capable of emitting light having a red-based color as a phosphorescent dopant, wherein
the carbazole compound containing a ring is represented by one of the following formulae:

Cz-L-Het-Na, or

Cz-L-Het-(Na)$_2$

Na represents a naphthyl group,
Het is a quinazolinyl group optionally comprising an aryl group,
Cz represents a carbazolyl groups represented by any one of the following general formulae (3) to (5):

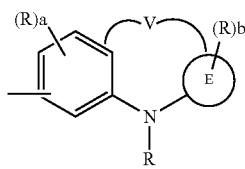

(3)

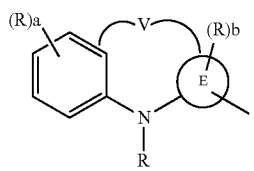

(4)

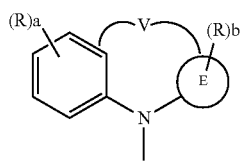

(5)

where:
a and b each represent an integer of 0 to 4,
R represents an aryl group which has 6 to 50 ring carbon atoms and which may have a substituent, a heterocyclic group which has 5 to 50 ring atoms and which may have a substituent, an alkyl group which has 1 to 50 carbon atoms and which may have a substituent, an alkoxy group which has 1 to 50 carbon atoms and which may have a substituent, an aralkyl group which has 7 to 50 ring carbon atoms and which may have a substituent, an aryloxy group which has 6 to 50 ring carbon atoms and which may have a substituent, an arylthio group which has 6 to 50 ring carbon atoms and which may have a substituent, a carboxyl group, a halogen atom, a cyano group, a nitro group, or a hydroxyl group, and, when multiple Rs are present, they may bond to each other to form a ring structure,
V represents a single bond, and
E represents a cyclic structure represented by a circle surrounding a symbol E, and represents an aromatic hydrocarbon group which has 6 to 50 ring carbon atoms and which may have a substituent, or a heterocyclic group which has 4 to 50 ring atoms and which may have a substituent; and
L represents a biphenyl residue or a terphenyl residue.

2. The organic electroluminescence device according to claim 1, wherein the red-based color comprises a yellow color, an orange color, a reddish orange color, or a red color.

3. The organic electroluminescence device according to claim 1, wherein the luminescent metal complex capable of emitting light having the red-based color shows an emission spectrum having a peak wavelength in a range of 560 to 700 nm.

4. The organic electroluminescence device according to claim 1, wherein a reducing dopant is added to an interfacial region between the cathode and the organic thin film layer.

5. The organic electroluminescence device according to claim 2, wherein the luminescent metal complex capable of emitting light having the red-based color shows an emission spectrum having a peak wavelength in a range of 560 to 700 nm.

6. The organic electroluminescence device according to claim 2, wherein a reducing dopant is added to an interfacial region between the cathode and the organic thin film layer.

7. The organic electroluminescence device according to claim 3, wherein a reducing dopant is added to an interfacial region between the cathode and the organic thin film layer.

8. The organic electroluminescence device according to claim 1, wherein Cz represents a carbazolyl group represented by the general formula (5).

9. The organic electroluminescence device according to claim 8, wherein L represents a residue of biphenyl.

10. The organic electroluminescence device according to claim 1, wherein E represents an optionally substituted aromatic hydrocarbon group which has 6 ring carbon atoms.

11. The organic electroluminescence device according to claim 1, wherein a in formulae (3) to (5) is 0.

12. An organic electroluminescence device, comprising an organic thin film layer composed of one or more layers comprising a light emitting layer, the organic thin film layer being interposed between a cathode and an anode, wherein the light emitting layer includes a carbazole compound containing a ring as a host material and a luminescent metal complex capable of emitting light having a red-based color as a phosphorescent dopant, wherein the carbazole compound containing a ring is represented by one of the following compounds:

(H-5)

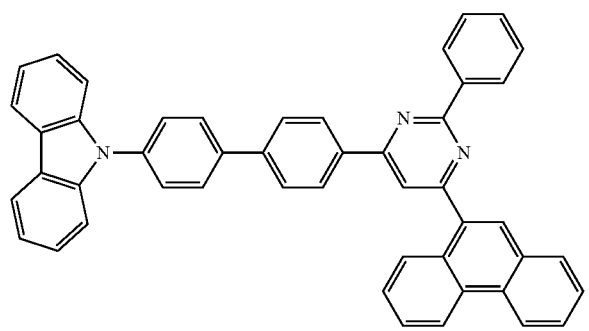

(H-6)

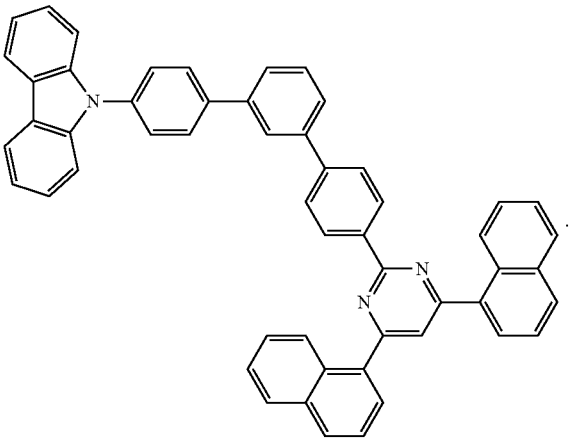

* * * * *